(12) United States Patent
Ciolfi

(10) Patent No.: US 7,861,217 B2
(45) Date of Patent: Dec. 28, 2010

(54) NON-GRAPHICAL MODEL DEPENDENCIES IN GRAPHICAL MODELING ENVIRONMENTS

(75) Inventor: John Ciolfi, Wellesley, MA (US)

(73) Assignee: The MathWorks, Inc., Natick, MA (US)

( * ) Notice: Subject to any disclaimer, the term of this patent is extended or adjusted under 35 U.S.C. 154(b) by 1399 days.

(21) Appl. No.: 11/323,533

(22) Filed: Dec. 30, 2005

(65) Prior Publication Data

US 2007/0157162 A1 Jul. 5, 2007

(51) Int. Cl.
*G06F 9/44* (2006.01)

(52) U.S. Cl. ............... 717/105; 717/104; 717/106; 717/109

(58) Field of Classification Search .......... 717/104, 717/105, 106, 109
See application file for complete search history.

(56) References Cited

U.S. PATENT DOCUMENTS

2001/0035879 A1* 11/2001 Washington et al. ....... 345/763

OTHER PUBLICATIONS

Heckerman, et al. "Dependency Networks for Inference, Collaborative Filtering, and Data Visualization", 2000, Journal of Machine Learning Research, vol. 1, p. 49-75.*
Aho, Alfred V. et al., "Compilers, PRinciples, Techniques, and Tools," Addison-Wesley Publishing Company, Michael A. Harrison, Ed., (1988), p. 1-809.
MathWorks, "Simulink, Model-Based and System-Based Design, Using Simulink, Version 5," The MathWorks, (1990-2004), p. 1-488.
Muchnick, Steven S., "Advanced Compiler Design Implementation," Harcourt Asia Pte. Ltd., (2000), p. 1-868.
International Search Report for Application No. PCT/US2006/049703, dated Jan. 25, 2008, p. 1-4.
European Office Action for Application No. 06849185.1, dated Jan. 29, 2010, p. 1-3.

* cited by examiner

*Primary Examiner*—Wei Y Zhen
*Assistant Examiner*—Qamrun Nahar
(74) *Attorney, Agent, or Firm*—Neslon Mullins Riley & Scarborough; Kevin J. Canning

(57) ABSTRACT

Graphical programming or modeling environments, such as a block diagram environment, are disclosed in which dependencies that influence how a model executes are defined without altering the visual representation of the model. In the graphical modeling or programming environment, users create a model that describes how the system is to execute. The users can then augment the model with non-graphical dependencies that provide general execution goals or specific dependencies between blocks. The user can augment the graphical model with dependency constraints specifying how the model should execute. The constraints are coupled to the model and can be optionally displayed on the model in a debugging/analysis mode to provide further insight into how the model executes.

58 Claims, 17 Drawing Sheets

| sort 1 | sort 2 | sort 3 |
|--------|--------|--------|
| Stage1A | Stage1A | Dintg |
| Stage1B | Stage2A | D/A |
| Stage1C | Stage1B | Stage1A |
| Stage2A | Stage1C | Stage1B |
| Stage2B | Stage2B | Stage1C |
| Stage2C | Stage2C | Stage2A |
| Join | Join | Stage2B |
| Dintg | Dintg | Stage2C |
| D/A | D/A | Join |

125

Generate initial sort using for
[ ] optimal code
[ ] "natural" connectivity and name placement
[ ] sink ASAP placement (stability)
[ ] sink ASAP placement followed by "natural" connectivity
[ ] user-defined condition

```
         ┌─ 150
Modify parallel state ordering of chart 'control logic' (drag and drop state name):
    1.  Oxygen_sensor_Mode
    2.  Pressure_Sensor_Mode
    3.  Throttle_Sensor_Mode ── 152
    4.  Speed_Sensor_Mode
    5.  Sens_Failure_Counter
    6.  Fueling_Mode ── 154
```
*Fig. 22*
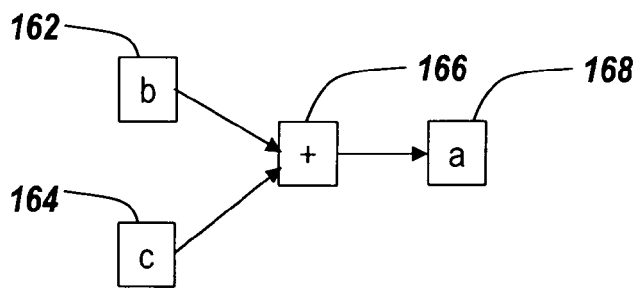
*Fig. 23*
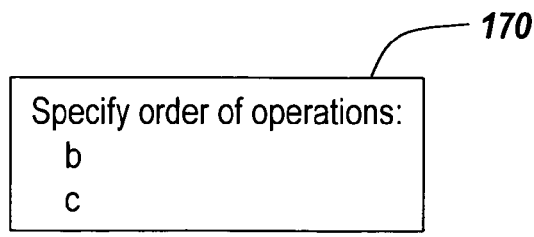
*Fig. 24*

NON-GRAPHICAL MODEL DEPENDENCIES IN GRAPHICAL MODELING ENVIRONMENTS

FIELD OF THE INVENTION

The present invention relates to graphical programming or modeling environments, in particular to methods, systems and mediums for providing non-graphical model dependencies in the graphical programming or modeling environments.

BACKGROUND OF THE INVENTION

Various classes of graphical models describe computations that can be performed on application specific computational hardware, such as a computer, microcontroller, FPGA, and custom hardware. Classes of such graphical models may include time-based block diagrams such as those found within Simulink® version 6.3 (R14sp3) from The MathWorks, Inc. of Natick, Mass., state-based and flow diagrams such as those found within Stateflow® from The MathWorks, Inc. of Natick, Mass., physical models such as those found within SimMechanics from The MathWorks, Inc. of Natick Mass., entity flow network diagrams such as those found within SimEvents from The MathWorks, Inc. of Natick, Mass., discrete-event based diagrams, data-flow diagrams, and software diagrams such as those within the Unified Modeling Language (UML). A common characteristic among these various forms of graphical models is that they define semantics on how to interpret or execute the model.

In modeling a system in a graphical modeling environment, the system to be modeled is described using blocks and lines. Usually, the blocks define operations, represent mathematical equations, or contain state information. The lines or signals can be used to carry information, describe dependencies, or define relationships between the blocks. The lines can also have operations or mathematics associated with them. There are many graphical modeling domains, each with its own semantics that dictate what the models mean and how the models can be executed or translated to an execution environment. Conventional graphical modeling environments often have a great deal of freedom in how models are executed. For example, in time-based block diagrams, blocks are typically ordered (sorted) as part of the preparation of a model for execution. The ordering does make use of some of the signals, but in general there are a large number of valid sorts that will all yield the same (correct) answer. This freedom results in widely varying executions of models that are functionally equal. These variations can cause confusion in analysis of model execution or inspection of the execution environment.

Conventional modeling environments allow a user to add dependencies between blocks via explicit (extra) lines or textual information, such as the priorities and placement groups provided in Simulink®. A block priority specifies the order in which the equations associated with a block are evaluated with respect to other blocks. Placement groups are a way of causing each class of block methods for a specified set of blocks to be "placed together" in the block method execution lists. These means are, however, cumbersome to use and fall short of achieving desired results in a short period of time. In particular, the block sorting priorities fall short of enabling the user to specify execution dependencies that can be understood and managed at the model-wide level. Moreover, this explicit specification of the extra dependencies hurts the readability of the diagram. Therefore, it is desired to provide new methods and systems for controlling the model execution without graphically (pictorially) altering the visual representation of the model by providing non-graphical model dependencies to establish the desired execution behavior of models.

SUMMARY OF THE INVENTION

The present invention provides graphical programming or modeling environments, such as a block diagram environment, in which dependencies that influence how a model executes are defined without altering the visual representation of the model. In the graphical modeling environment (or graphical programming environment), a user can create a model describing a system and execute (simulate) the model or generating code from the model. Using the present invention, the user can then augment the model with non-graphical dependencies that provide general execution goals or specific dependencies between blocks. The present invention enables the user to augment the graphical model with dependency constraints specifying how the model should execute. The constraints are coupled to the model and can be optionally displayed on the model in a debugging/analysis mode to provide further insight into how the model executes.

In one aspect of the present invention, a method is provided for providing non-graphical dependency information in a graphical modeling environment. The method includes the step of providing a graphical model in the graphical modeling environment. The method also includes the step of enabling a user to add non-graphical model dependency information to the graphical model. The non-graphical dependency information does not change a visual representation of the graphical model. Optionally, the user can choose to view the non-graphical dependency information on the model for debugging and analysis of the model execution.

In another aspect of the present invention, a system is provided for adding non-graphical dependency information to a graphical model. The system includes a graphical modeling environment for providing a graphical model. The system also includes a user interface for enabling a user to add non-graphical model dependency information to the graphical model. The non-graphical dependency information does not change a visual representation of the graphical model.

In another aspect of the present invention, a medium for holding instructions executed in a computer is provided to add non-graphical dependency information in a graphical modeling environment. The instructions are executed to provide a graphical model in the graphical modeling environment. The instructions are also executed to enable a user to add non-graphical model dependency information to the graphical model. The non-graphical dependency information does not change a visual representation of the graphical model.

In an illustrative embodiment of the present invention, the user can augment the graphical model with dependencies selecting sorting criterion that influences model execution.

In another illustrative embodiment, a user can augment the graphical model with dependencies by specifying relative dependencies between blocks that influence model execution.

In another illustrative embodiment, the method, system and medium ensures inspection and verification of the execution environment by ensuring minimal alteration of the execution orderings by preserving existing block orderings when edits are made to the model.

BRIEF DESCRIPTION OF THE DRAWINGS

The aforementioned features and advantages, and other features and aspects of the present invention, will become better understood with regard to the following description and accompanying drawings, wherein:

FIG. 22 depicts an exemplary dialog for changing the ordering of parallel states shown in FIG. 21;

FIG. 23 is an example of a data flow diagram to which the concept of the present invention applies; and FIG. 24 depicts an exemplary dialog for changing the dependency information of the model shown in FIG. 23.

DETAILED DESCRIPTION

Figure 1:
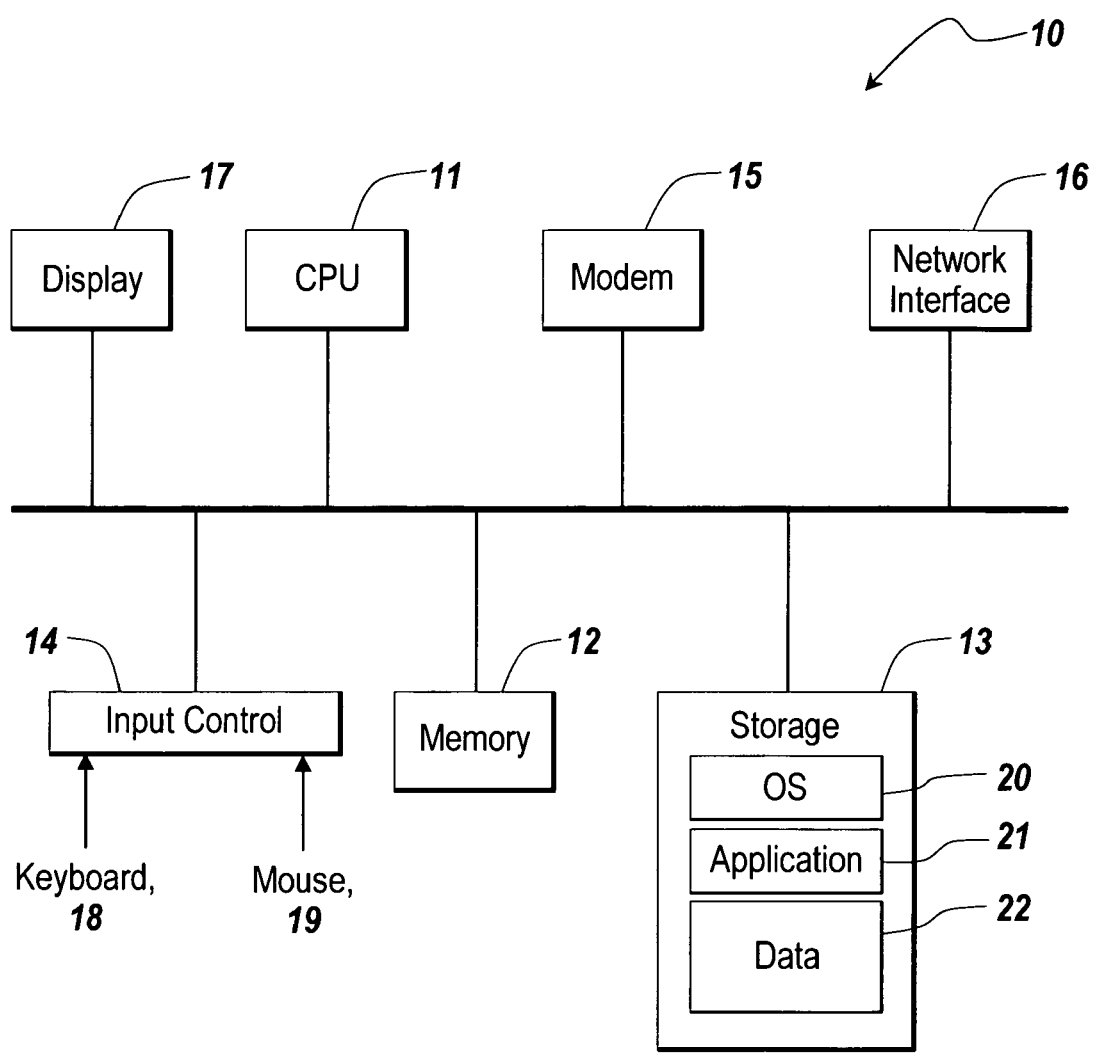
FIG. 1 shows an exemplary computing device suitable for practicing the illustrative embodiment of the present invention.

Certain embodiments of the present invention are described below. It is, however, expressly noted that the present invention is not limited to these embodiments, but rather the intention is that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The illustrative embodiment of the present invention provides a graphical programming or modeling environment in which a graphical program or model is simulated/executed or code is generated for the model. The terms "program/programming" and "model/modeling" will be used interchangeably in the description of the illustrative embodiment. In the description of the illustrative embodiment, the simulation of the graphical program/model is also referred to as the execution of the program/model.

The illustrative embodiment will be described below solely for illustrative purposes relative to a time-based block diagram environment. Although the illustrative embodiment will be described relative to the time-based block diagram environment, one of skill in the art will appreciate that the present invention may apply to other graphical programming/modeling environments, including state-based, event-based, data flow diagram, physical diagram environments, entity flow networks, and software diagram environments such as the Unified Modeling Language (UML) environment, as long as the graphical model has some notion of semantics that allows it to be interpreted or transformed into an executable for a computer processor/microcontroller or directly synthesized in application-specific hardware.

An exemplary time-based block diagram environment can be found in Simulink® from The MathWorks, Inc. of Natick, Mass. Simulink® provides tools for modeling and simulating a variety of dynamic systems in one integrated, graphical environment. Simulink® enables users to design a block diagram for a dynamic system, simulate the system's behavior, analyze the performance of the system, and refine the design of the system. Simulink® allows users to design models of systems through a user interface that allows drafting of block diagrams representing systems. All of the blocks in a block library provided by Simulink® and other programs are available to users when the users are building the block diagram. Individual users may be able to customize this block library to: (a) reorganize blocks in some custom format, (b) delete blocks they do not use, and (c) add custom blocks they have designed. The blocks may be dragged through some human-machine interface (such as a mouse or keyboard) from the block library on to the window (i.e., model canvas). Simulink® also allows users to simulate the models to determine the behavior of the systems. Simulink® includes a block diagram editor that allows users to perform such actions as draw, edit, annotate, save, and print out block diagram representations of systems. The block diagram editor is a graphical user interface (GUI) component that allows drafting of block diagram models by users. In Simulink®, there is also a textual interface with a set of commands that allow interaction with the graphical editor, such as the textual interface provided in MATLAB®. Using this textual interface, users may write special scripts that perform automatic editing operations on the block diagram. Simulink® also allows users to simulate the models to determine the behavior of the systems. Simulink® includes a block diagram execution engine that carries out the task of compiling and linking the block diagram to produce an "in-memory executable" version of the model that is used for generating code and/or simulating a block diagram model.

In the illustrative embodiment, blocks are connected by lines in a graphical model. The lines may imply dependencies that influence how the blocks execute. In imperative environments, such as certain data flow diagram modeling environments, the lines are true dependencies. In declarative environments, such as time-based block diagram modeling environments, some lines (signals) can be leveraged to achieve optimal execution, but are not an explicit dependency.

The illustrative embodiment enables a user to specify additional dependencies between blocks in a diagram without having to add "clutter" to the diagram. In the illustrative embodiment, the dependencies are specified without altering the visual representation of the diagram. The illustrative embodiment enables the user to augment the diagram with non-graphical dependency constraints specifying how the diagram is to execute. The constraints are coupled to the diagram and can be optionally displayed on the diagram, for example, in a debugging/analysis mode of the diagram.

The illustrative embodiment can be practiced with any modeling environments including imperative and declarative environments. For example, in a data flow (imperative) diagram, one may wish to impose dependencies that aren't explicitly shown by the lines in the diagram. Likewise, in a time-based block diagram (declarative) environment, one may wish to add additional dependencies that place constraints on the block sorting, thereby influencing both code generation and model simulation/execution.

The illustrative embodiment will be described below relative to a Simulink® model. Nevertheless, those of skill in the art will appreciate that the present invention may be practiced relative to models implemented in other graphical modeling environments, including but not limited to LabVIEW from National Instruments Corporation of Austin, Tex, and Rational Rose from IBM of White Plains, N.Y., Rhapsody and Statemate both from I-Logic Inc. of Andover, Mass., Simplorerfrom Ansoft Corp. of Pittsburgh, Pa., Ptolemy-based tools, Scade from Esterel Technologies Inc. of Mountain View of CA, RT-LAB from OPAL-RT of Montréal, Québec, Canada, etc.

FIG. 1 is an exemplary computing device 10 suitable for practicing the illustrative embodiment of the present invention, which provides a block diagram environment. One of ordinary skill in the art will appreciate that the computing device 10 is intended to be illustrative and not limiting of the present invention. The computing device 10 may take many forms, including but not limited to a workstation, server, network computer, quantum computer, optical computer, bio computer, Internet appliance, mobile device, a pager, a tablet computer, and the like.

The computing device 10 may be electronic and include a Central Processing Unit (CPU) 11, memory 12, storage 13, an input control 14, a modem 15, a network interface 16, a display 17, etc. The CPU 11 controls each component of the computing device 10 to provide the block diagram environment. The memory 12 temporarily stores instructions and data and provides them to the CPU 11 so that the CPU 11 operates the computing device 10 and runs the block diagram environment. The storage 13 usually contains software tools for applications. The storage 13 includes, in particular, code 20 for the operating system (OS) of the device 10, code 21 for applications running on the operation system including applications for providing the block diagram environment, and data 22 for block diagrams created in the block diagram environment. Those of ordinary skill in the art will appreciate that the application can be stored in the memory 12 as well, much like the data, and even the OS, or they can be stored on the network described below with reference to FIG. 2.

Optionally, the computing device 10 may include multiple CPUs for executing software loaded in the memory 12, and other programs for controlling system hardware. Each of the CPUs can be a single or multiple core processor. The code loaded in the memory 12 may run in a virtualized environment, such as in a Virtual Machine (VM). Multiple VM's may be resident on a single processor. Also, part of the application could be run in hardware, for example, by configuring a field programmable gate array (FPGA) or creating an application specific integrated circuit (ASIC).

The input control 14 may interface with a keyboard 18, a mouse 19, and other input devices. The computing device 10 may receive through the input control 14 input data necessary for creating block diagrams, such as the selection of the attributes and operations of component blocks in the block diagrams. The computing device 10 may also receive through the input control 14 input data necessary for controlling the execution of the block diagrams. The computing device 10 may display in the display 17 user interfaces for the users to create or edit the block diagrams.

Figure 2:
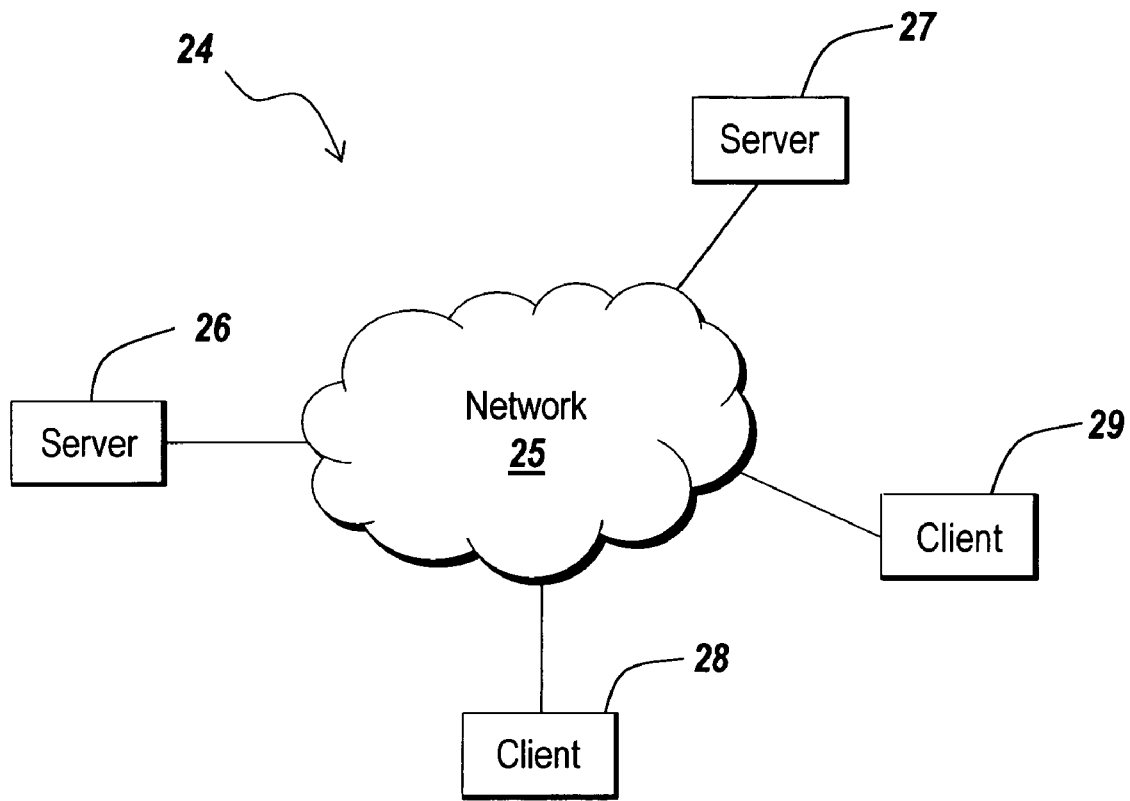
FIG. 2 shows an exemplary network environment suitable for practicing the illustrative embodiment of the present invention.

FIG. 2 is an exemplary network environment 24 suitable for the distributed implementation of the illustrative embodiment. The network environment 24 may include one or more servers 26 and 27 coupled to clients 28 and 29 via a communication network 25. The network interface 16 and the modem 15 of the computing device 10 enable the servers 26 and 27 to communicate with the clients 28 and 29 through the communication network 25. The communication network 25 may include Internet, intranet, LAN (Local Area Network), WAN (Wide Area Network), MAN (Metropolitan Area Network), Wireless, Optical, etc. The communication facilities can support the distributed implementations of the present invention.

In the network environment 24, the servers 26 and 27 may provide the clients 28 and 29 with software components or products under a particular condition, such as a license agreement. The software components or products may include those for providing a block diagram environment and a block diagram created in the block diagram environment. The clients 28 and 29 may construct a block diagram using the software components and products provided by the servers 26 and 27, and submit the block diagram to the servers 26 and 27 for the execution of the block diagram. The servers 26 and 27 may execute the block diagram and return the execution results to the clients.

Block Diagram Environment

Figure 3:
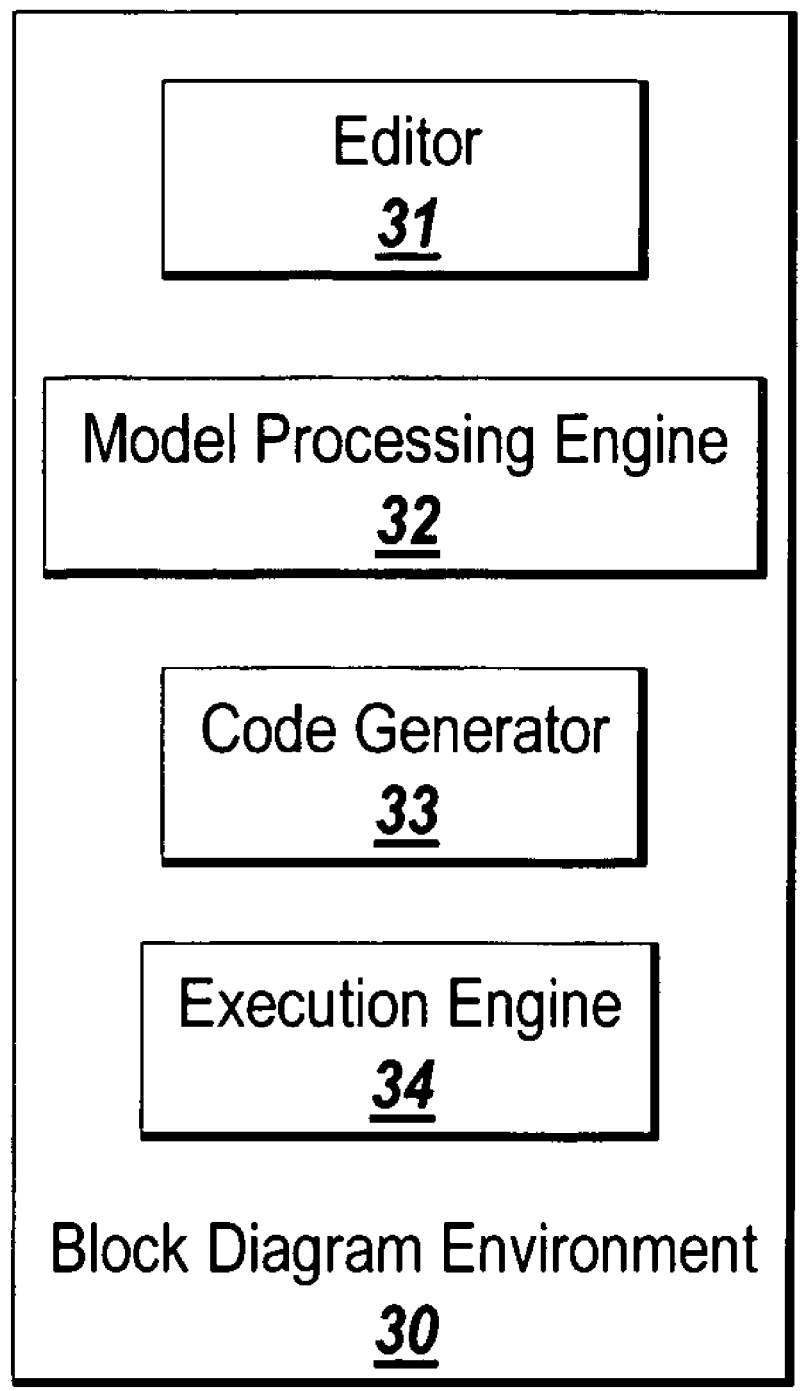
FIG. 3 depicts an exemplary block diagram environment provided in the illustrative embodiment of the present invention.

FIG. 3 depicts an exemplary block diagram environment 30 provided in the illustrative embodiment. The block diagram environment 30 may include an editor 31, a model processing engine 32, a code generator 33, and a model execution engine 34. The block diagram environment 30 allows a user to perform various types of tasks including constructing system models through a user interface that allows drafting block diagram models, allowing augmentation of a pre-defined set of blocks with custom user-specified blocks, the use of the block diagram model to compute and trace the temporal evolution of the dynamic system's outputs ("executing" the block diagram), and automatically producing either deployable software systems or descriptions of hardware systems that mimic the behavior of either the entire model or portions of it (referred to herein as "code generation").

Figure 4:
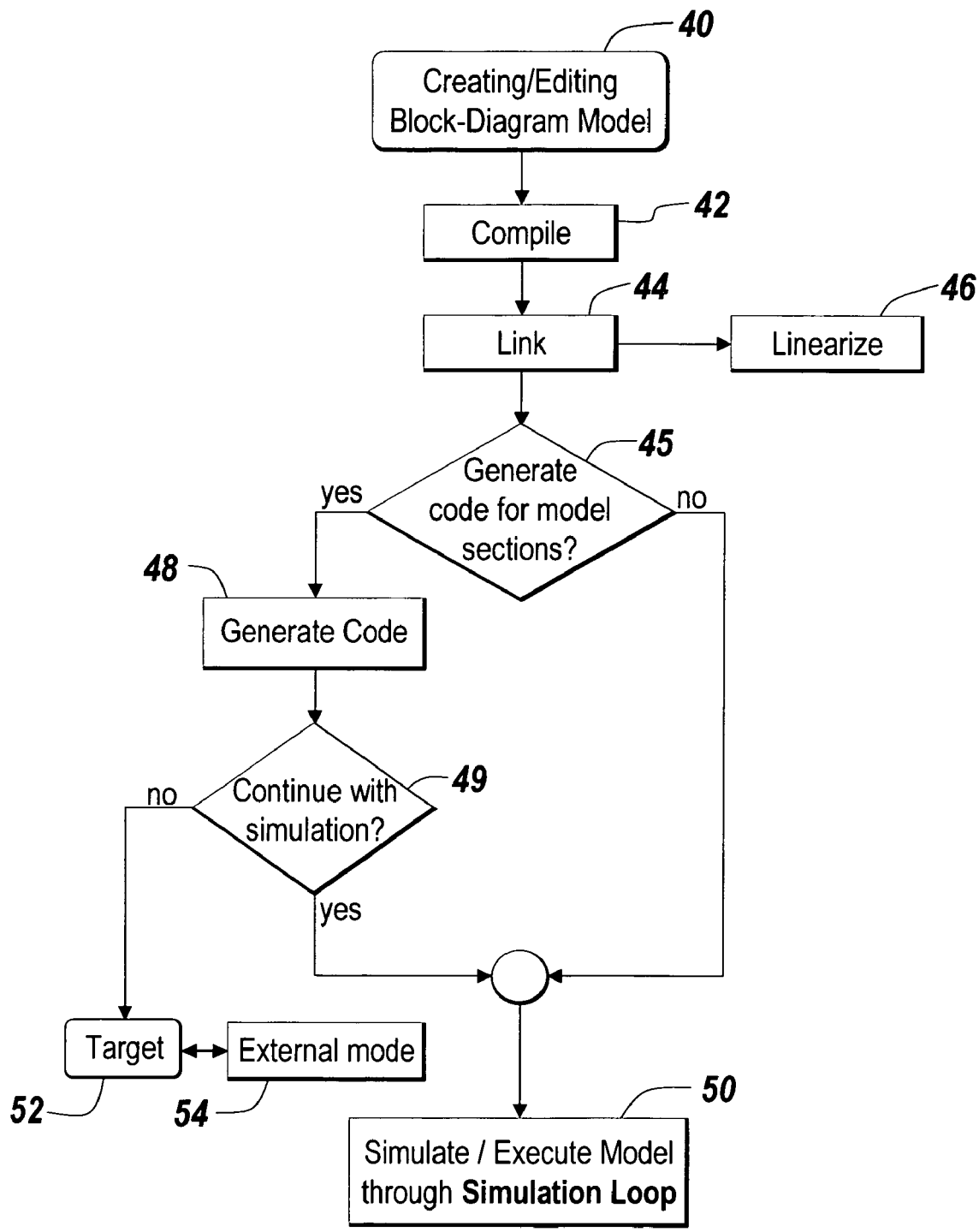
FIG. 4 is a flow chart of the sequence of steps used to perform simulation of the block diagram.

FIG. 4 is a flow chart showing an exemplary operation of the block diagram environment 30. A block diagram is created/edited (step 40) and compiled (step 42) to produce an "in-memory executable" version of the block diagram that is used for generating code and/or simulating, trimming or linearizing the block diagram model. Following the compilation stage, is the model link stage (step 44) which may also produce linear models (step 46). Code may or may not be generated (step 45). If code is generated (step 48), a decision is made (step 49) whether to continue the simulation. If the decision is made to continue the simulation the model is simulated/executed through the Simulation Loop (step 50). If the simulation is not continued, the code may be delivered to a target (step 52) and executed in an external mode (step 54). If code is not generated the block diagram may execute in interpretive mode when entering the simulation loop (step 50). The operation of the block diagram environment 30 will be described below in more detail.

Figure 5:
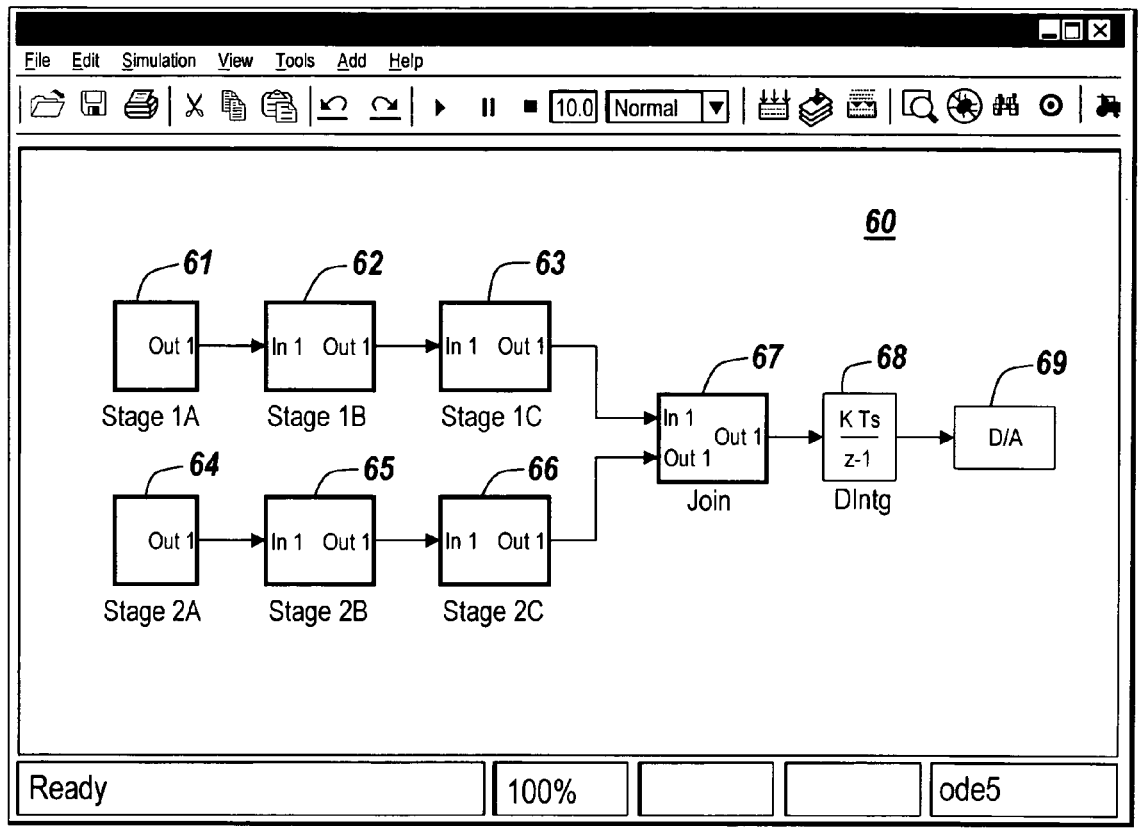
FIG. 5 depicts an exemplary block diagram model created in the illustrative embodiment.

The block diagram editor 31 allows users to perform such actions as draw, edit, annotate, save, and print out block diagram representations of dynamic systems. As noted earlier, blocks are the fundamental mathematical elements of a classic block diagram model. The block diagram editor 31 is the graphical user interface (GUI) component that allows drafting of block diagram models by a user. In Simulink®, there is also a textual interface with a set of commands that allow interaction with the graphical editor 31. Using this textual interface, users may write special scripts that perform automatic editing operations on the block diagram. A user generally interacts with a set of windows that act as canvases for the model. There is generally more than one window for a model because models may be partitioned into multiple hierarchical levels through the use of subsystems. FIG. 5 shows an exemplary block diagram 60 constructed using the editor 31 in the illustrative embodiment. The block diagram 60 includes Stage1A block 61, Stage1B block 62, Stage1C block 63, Stage2A block 64, Stage2B block 65, Stage2C block 66, Join block 67, DIntg block 68, and D/A block 69. The Stage1A block 61, Stage1B block 62, Stage1C block 63, Stage2A block 64, Stage2B block 65 and Stage2C block 66 are exemplary blocks that produce an output by performing a given function with a feedthrough input. The Join block 67 is an exemplary blocks that produce an output by performing a given function, such as an addition, with two feedthrough inputs. The DIntg block 68 is a discrete-time integrator block that doesn't have direct feedthrough. The D/A block 69 is an exemplary block that produces an analog signal from a digital input signal. One of skill in the art will appreciate that the block diagram model 60 and its elements 61-69 are illustrative and not limiting the scope of the present invention. The construction of the block diagram 60 will be described below in more detail with reference to FIGS. 8-16.

Once a block diagram model has been constructed using the editor 31, the processing engine 32 carries out the task of compiling the block diagram to produce an "in-memory executable" version of the model that is used for generating code and/or simulating a block diagram model. The compile stage involves checking the integrity and validity of the block interconnections in the block diagram. Virtual blocks play no semantic role in the execution of a block diagram. In this step, the virtual blocks in the block diagram are removed and the remaining non-virtual blocks are reconnected to each other appropriately. This compiled version of the block diagram with actual block connections is used in the execution process.

The way in which blocks are interconnected in the block diagram does not necessarily define the order in which the equations (methods) corresponding to the individual blocks will be solved (executed). The actual order is partially determined during the sorting step in compilation.

The first step in sorting involves transforming the graphical block diagram into a compiled (in-memory) directed graph consisting of arcs and vertices. The vertices are derived from some of the non-virtual blocks. For instance, virtual blocks do not appear in the directed graph. The arcs represent data dependencies between the vertices. The data dependencies do not correspond to the signals in the block diagram. For example, all signals that connect to input ports without direct feed through are "cut" or ignored. In addition, data dependencies are added to capture implicit dependencies. For example, all inputs to a Function-Call subsystem are implicit data dependencies to the owner (caller) block.

Figure 6:
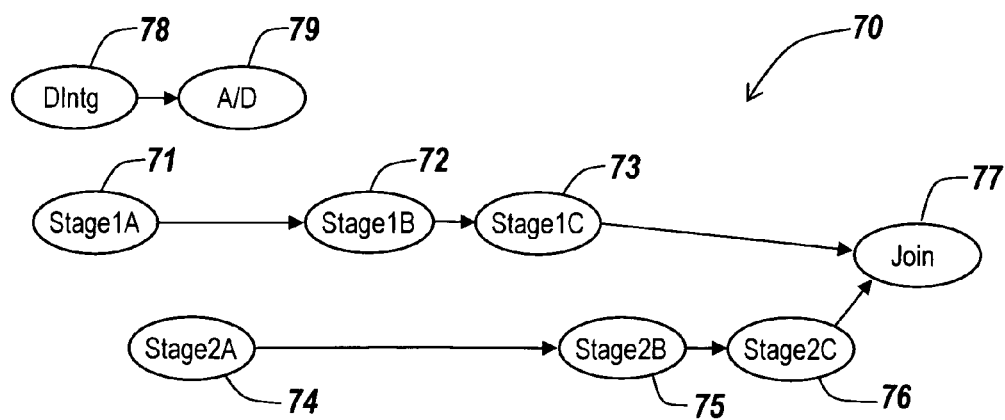
FIG. 6 depicts a directed graph associated with the block diagram model depicted in FIG. 5.

FIG. 6 is an exemplary directed graph converted from the block diagram 60 shown in FIG. 5. Since the blocks 61-69 in the block diagram 60 are not virtual, the blocks 61-69 appear on the corresponding directed graph 70. The directed graph 70 therefore includes Stage1A vertex 71, Stage1B vertex 72, Stage1C vertex 73, Stage2A vertex 74, Stage2B vertex 75, Stage2C vertex 76, Join vertex 77, DIntg vertex 78, and D/A vertex 79. The vertices are connected by edges.

The graph is used to sort the blocks into a linear sorted list. During the sorting of the graph into the list, strongly connected components are identified. The term strongly connected component, which is a term that originates from graph theory, is a subset, S, of the blocks of a block diagram such that any block in S is reachable from any other block in S by following signal connections and S is not a subset of any larger such set. Strongly connected components are flagged as algebraic loops when all blocks have direct feed through. Such loops correspond to a set of algebraic equations and are solved using iterations and perturbations during block diagram execution by solving for the algebraic variables. Algebraic variables are either specified by the user via Initial Condition blocks or chosen by the execution engine 34.

Sorting also takes into consideration other user specified dependencies between the blocks, which will be described below in more detail with reference to FIG. 8-18. The term "dependency" as used herein refers to the edges of the compiled directed graph and not the signals found within a block diagram. Attempting to correlate data dependencies directly to the signals found within a block diagram is incorrect and leads to the conclusion that Simulink® does not satisfy data dependencies, i.e., the execution of the operations or block methods does not satisfy data dependencies if one interprets signal connectivity as specifying data dependencies.

After compilation, the link stage commences. During this stage physical memory allocations are made in order to prepare for execution. Buffers are allocated for block input and output data buffers, states, and work areas. Additionally, block method execution lists that are derived from the sorted list allow for execution of the block diagram. Each block method execution list is a list of block methods that are to be executed in a sequence when each method within the list has a sample hit. There is generally a set of block method execution lists associated with each layer of the block diagram that corresponds to a non-virtual subsystem. Non-virtual subsystems are either defined by the user or automatically synthesized during compilation to either efficiently execute the model or simplify the implementation of the semantics defined by Simulink®. In multi-tasking mode, the lists within each layer may be further partitioned when block diagrams have blocks with different sample rates.

Those skilled in the art will recognize that while the block method execution lists are derived from the sorted list, they do not necessarily correspond one-to-one with the sorted lists. First, each block method execution lists contains only blocks that have such a block method of the given type (class)

defined by the list. Second, block methods corresponding to components like the function-call subsystem do not appear on the block method execution lists because they are executed by an "owner" block.

Although included in the discussion of the compilation stage, it is not required that the time-based diagram perform the block sorting step during compilation. The sorting step is performed to achieve efficient execution. Ignoring efficiency, there is no semantic reason to perform the sorting step. Any random ordering of the block methods will work. In fact, any ordering of all block method execution lists except the Output block method execution list will result in the same level of efficiency. Randomly re-ordering the Output block method execution list will yield correct answers. If the Output block method list is randomly ordered, then the Simulation engine, when executing the Output block method execution list, continues sequencing through the Output block method execution list at each point in time until there are no changes.

After linking has been performed, the code generator 33 may generate code. In this stage, the code generator 33 may choose to translate the block diagram model (or portions of it) into either software modules or hardware descriptions (broadly termed code). If this stage is performed, then the stages that follow use the generated code during the execution of the block diagram. If this stage is skipped completely, then the execution engine 34 uses an interpretive mode of execution for the block diagram. In some cases, the user may not proceed further with the execution of the block diagram because they would like to deploy the code outside the confines of the block diagram software. Upon reaching the simulation stage, the execution engine 34 uses a simulation loop to execute block methods in a pre-defined ordering upon a sample hit to produce the system responses as they change with time.

Specifying Non-Graphical Model Dependencies

Figures 7, 8:
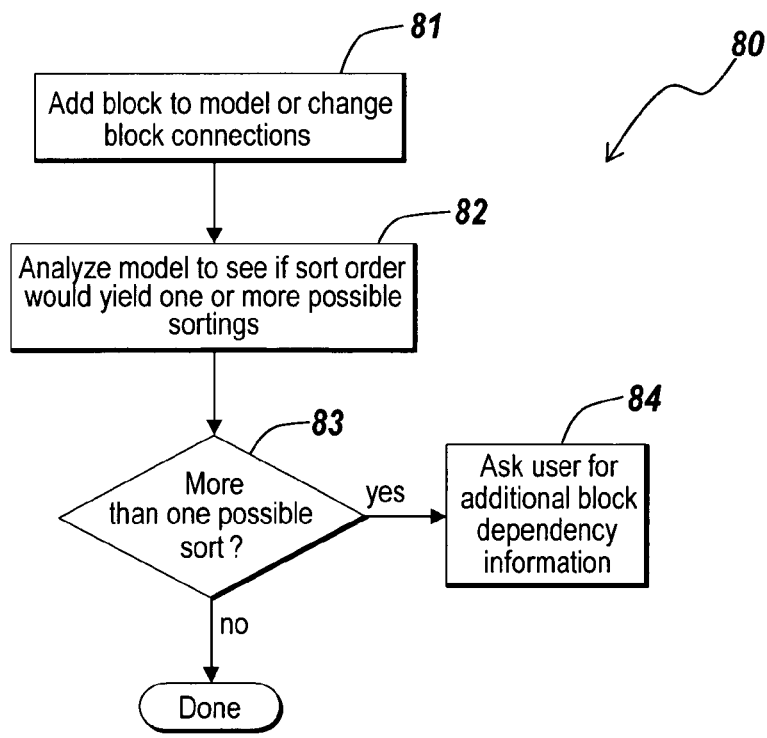
FIG. 7 depicts possible sorted list generated from the directed graph of FIG. 6.
FIG. 8 is a flow chart showing an exemplary operation for adding dependency information at model edit or construction time.

Referring back to FIGS. 5 and 6, the engine 32 has much freedom to sort the graph 70 derived from the information in the block diagram 60. Since the signals represent relationships between blocks in the diagram 60 and the signals that connect to ports with direct feedthrough are kept for the purpose of optimal execution, a plurality of sorted lists can be possible from the compiled directed graph 70. FIG. 7 shows some of the possible sorted lists produced from the compiled directed graph 70. The sorted lists include the elements appearing as vertices in the directed graph 70 sorted into order. The illustrative embodiment enables a user to add non-graphical model dependency information to the block diagram 60 to specify a sorted list for the execution of the block diagram 60.

The illustrative embodiment allows for the addition of dependency information without changing the default visual representation of the model. The augmentation of the dependencies can be achieved via several means. The following description describes two preferable approaches to the implementation, during the model edit/construction time or after the model edit/construction time. However, one can envision other approaches such as manual specification of orderings in the blocks. In addition, these two different approaches could be used together where some of the non-graphical dependencies are entered during the model edit/construction time and some after the model edit/construction time.

Addition of Non-Graphical Dependency Information at Model Construction

FIG. 8 is a flow-chart describing how the model/block diagram editor 31 interacts with the user to get the non-graphical dependency information during the model edit or construction time. The editor 31 may provide user interfaces that enable a user to add blocks to the model and change connections between the blocks (step 81). The model is then analyzed to determine whether the sort of the model can yield one or more possible sorted lists (step 82). If there is more than one possible sorted lists in the model (step 83), the editor 31 may provide a user interface asking the user for additional model dependency information (step 84). These steps are described below in more detail with reference to FIG. 9-16.

Figure 9:
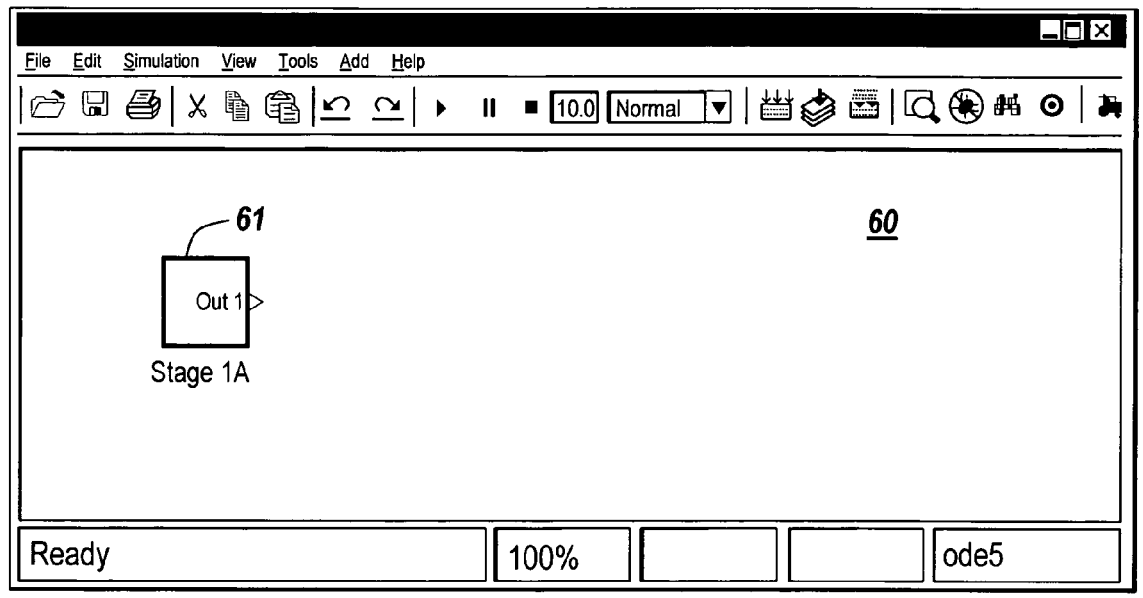
FIGS. 9 and 10A depict the construction of the block diagram model of FIG. 5.
Figure 10A:
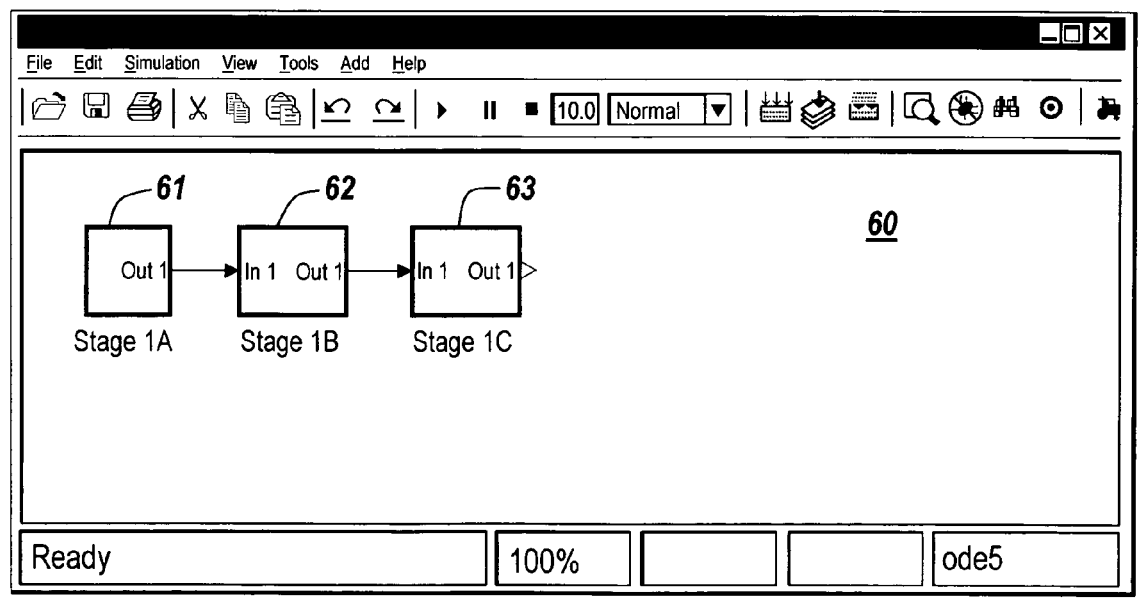

FIG. 9 shows that a user adds the Stage1A block 61 to the model 60. If the methods of Stage1A block 60 are executed once for a model evaluation, there may be only one sorted list and the user is not requested to provide additional dependency information. The user can add the Stage1B block 62 and the Stage1C block 63, as depicted in FIG. 10A, without being requested for additional dependency information if the serial connection of the Stage1A block 61, the Stage1B block 62 and the Stage1C block 63 produces only one possible sorted list.

In some instances, there can be multiple sorted lists that are used during the execution of the model when a certain method of the Stage1A block 60 is executed more than once for an evaluation of the model. If the methods of Stage1A block 60 are executed more than once for a model evaluation, the Stage1A block 60 may be on a sorted list multiple times.

Figure 10B:
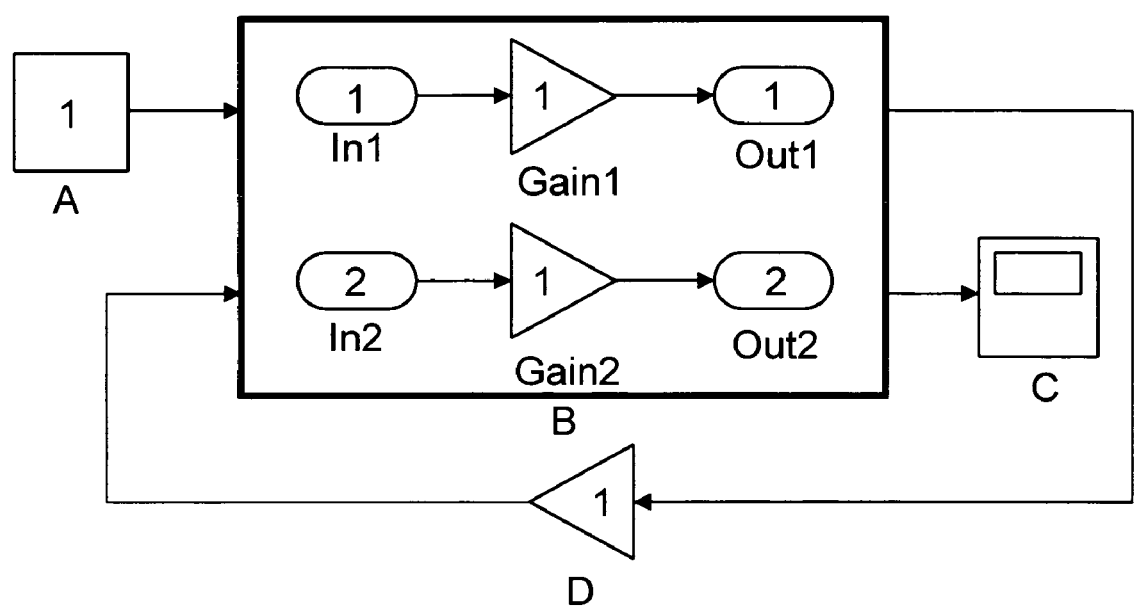
FIG. 10B shows an exemplary model in which a subsystem and the blocks inside of it are executed twice for the execution of the model.

FIG. 10B shows an exemplary model in which a subsystem and the blocks inside of it are executed twice for the execution of the model. In the model, a constant A is connected to a subsystem B. The content of the subsystem B is shown on its icon. The subsystem B contains an input In1 and an input In2. The input In1 is connected to a gain Gain1 that connects to an output Out1. The input In2 is connected to a gain Gain2 that is connected to an output Out2. The output Out1 of the subsystem B is connected to a gain D that connects to an input In2 of the subsystem. The input In2 connects to a gain Gain2 that connects to the output Out2 of the subsystem B. The output Out2 connects to a scope C.

In this model the top level has a sorted list and the subsystem B has its own sorted list. Because the subsystem B is treated as one execution unit, it has to be executed twice for one model evaluation in order for the value on input In1 to become available on output Out2. So, the sorted list of the top level may be provided as follows.

A
B
D
B
C

On the sorted list of the top level, the subsystem B appears twice. The sorted list of the subsystem B may be provided as follows depending on whether the input In1 and the input In2 require execution, in which case they appear on the sorted list, or if they are a direct reference to the output of the connected blocks.

Gain1
Gain2

Note that an alternate sorted list

Gain2
Gain1 is equally valid.

The user may be provided with a user interface for enabling the user to dynamically select a sorted list of the subsystem B to use in the execution and code generation of the model. Alternatively, a sorted list can be determined programmatically to use for execution or code generation based on the user-defined criteria, such as those described below with reference to FIG. 18. With this feature of the present invention, the user can select one of multiple sorting lists dynamically during execution of the model that is used for the execution of the model.

Figure 11:
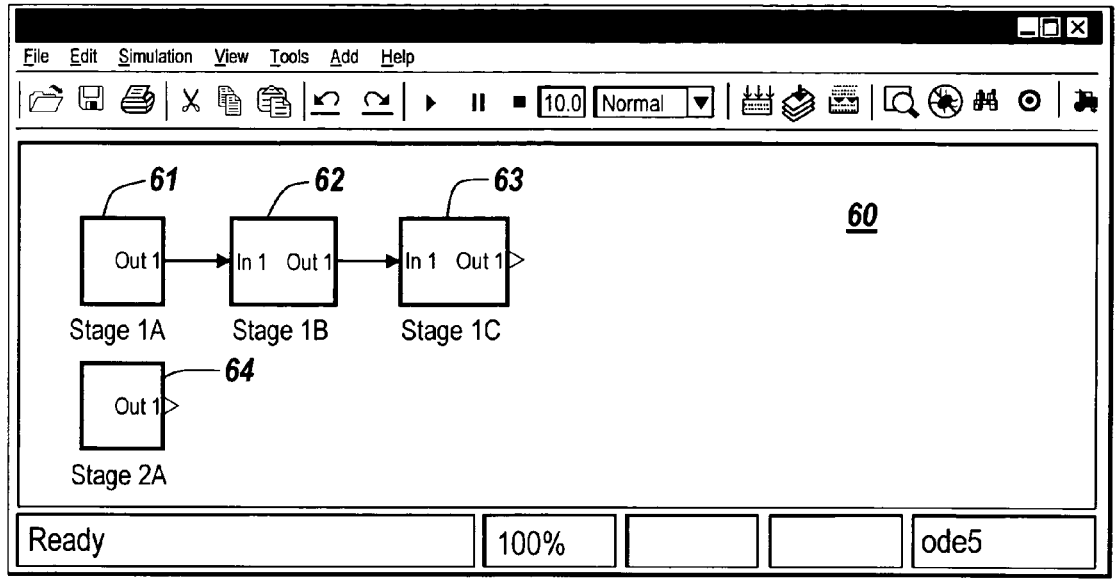
FIG. 11 depicts the construction of the block diagram model of FIG. 5 with an exemplary dialog for specifying model dependencies.
Figure 11:
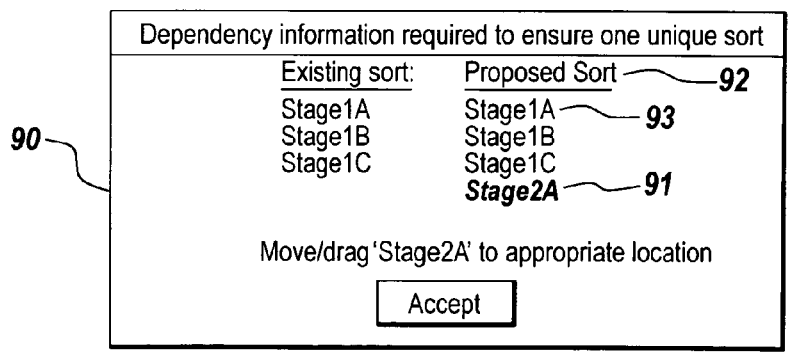
Figure 12:
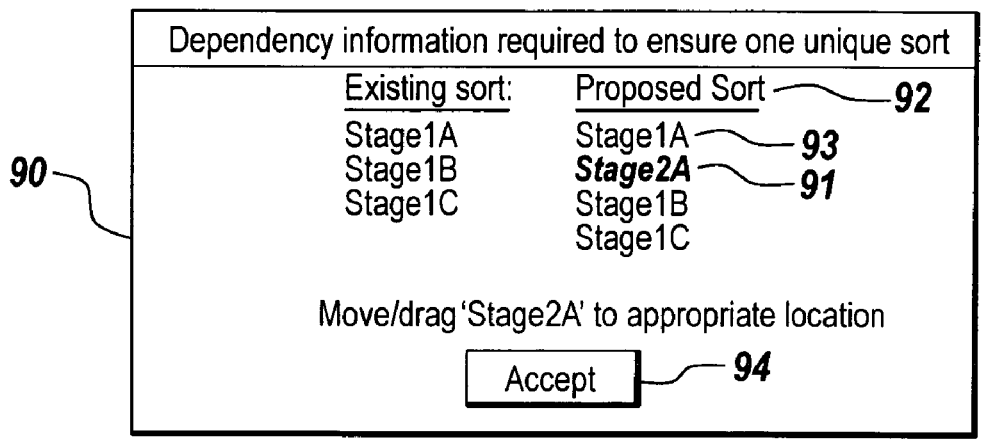
FIG. 12 is another view of the dialog depicted in FIG. 11.
Figure 13:
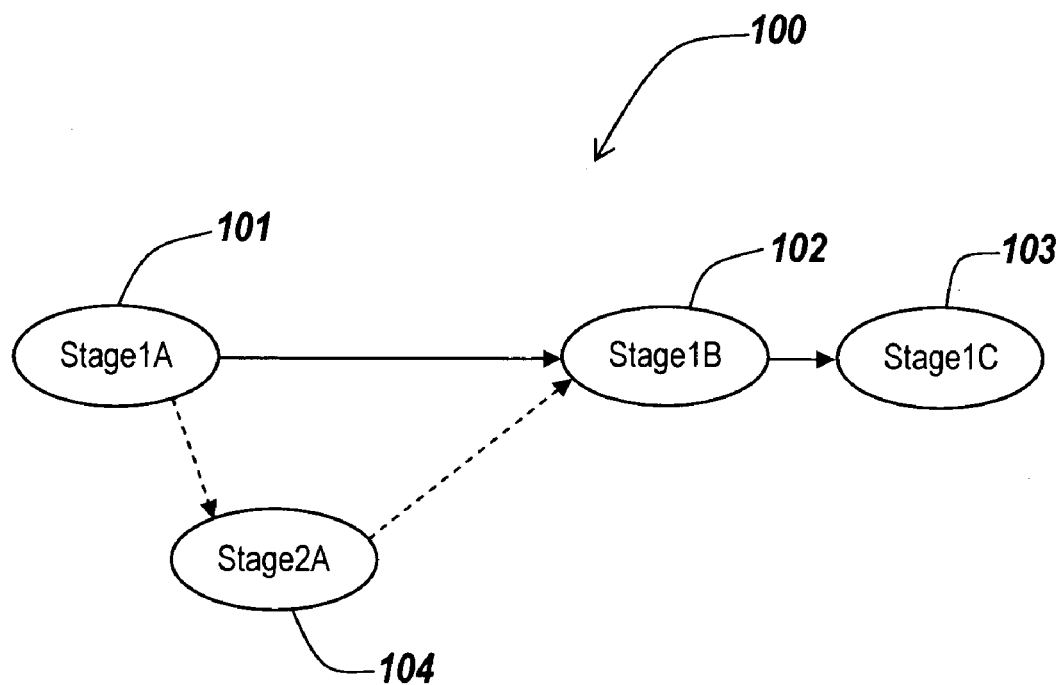
FIG. 13 depicts an exemplary internal graph representing the model dependencies.

When the user adds the Stage2A block 64 to the block diagram model 60, as depicted in FIG. 11, an additional dialog 90 is provided for asking for additional dependency information. On the dialog 90, the degrees of freedom are shown to the user by showing the relevant part of the sorted list and a proposed location. If this isn't the right location, then the user can move the block (the Stage2A block 91 on the dialog 90) in the proposed sort list 92 to the desired location, such as just after the Stage1A block 93 as shown in FIG. 12.

Clicking the Accept button 94 on the dialog 90 adds to the block diagram model 60 the non-graphical dependency information:

(1) dependency from Stage1A to Stage2A; and
(2) dependency from Stage2A to Stage1B.

The non-graphical dependency information can be added as a property of the blocks in the block diagram 60. The non-graphical dependency information is internally represented by the graph 100 depicted in FIG. 13. The internal graph 100 is similar to the directed graph 70 depicted in FIG. 6 and includes relevant vertices including the stage1A vertex 101, the stage1B vertex 102, the stage1C vertex 101, and the stage2A vertex 104. In the internal graph 100, the dotted lines represent the non-graphical dependency information added to the model via the dialog 90, so that the model 60 has one unique sorted list. In this example, the order of the sorted list is Stage1A vertex 101, the Stage2A vertex 104, the Stage1B vertex 102, and the Stage1C vertex 103. The illustrative embodiment shows that adding one block resulted in one degree of freedom. Those of ordinary skill in the art will appreciate that changing a connection can yield more than one degree of freedom, and the proposed sort list would have several items that could be moved.

Figure 14:
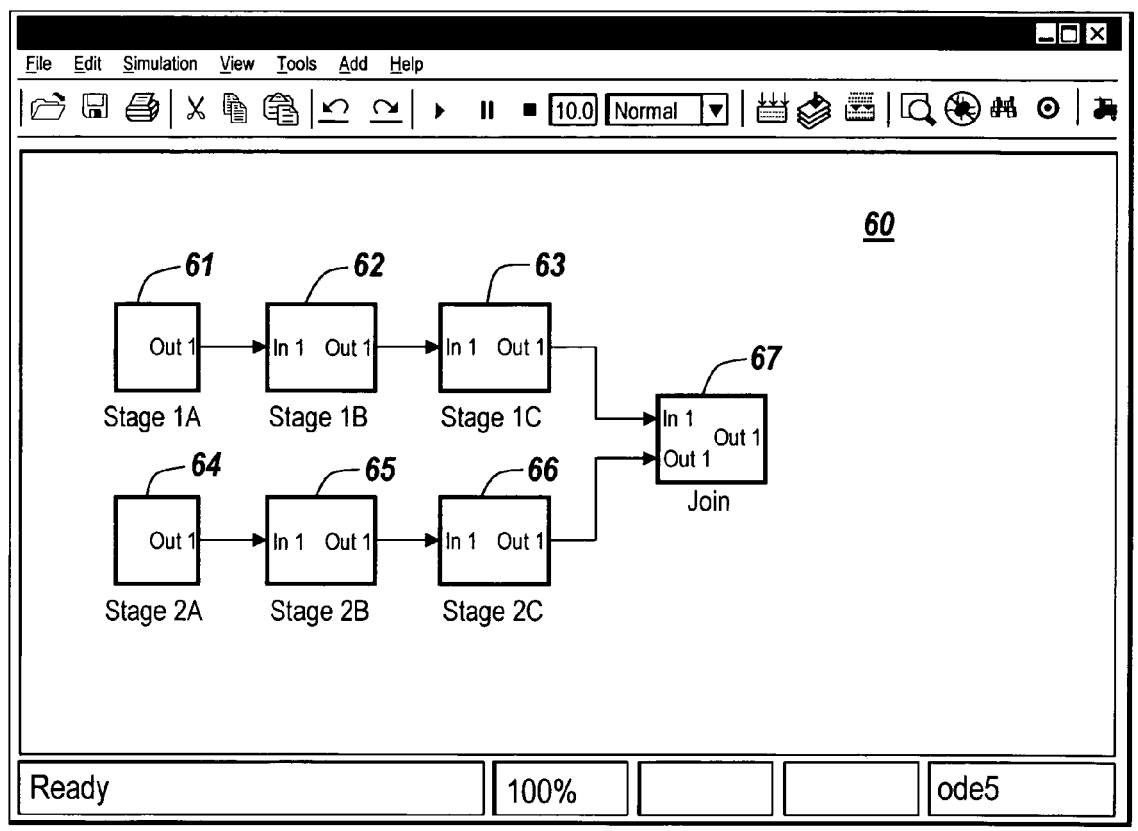
FIG. 14 depicts the construction of the block diagram model of FIG. 5.
Figure 15:
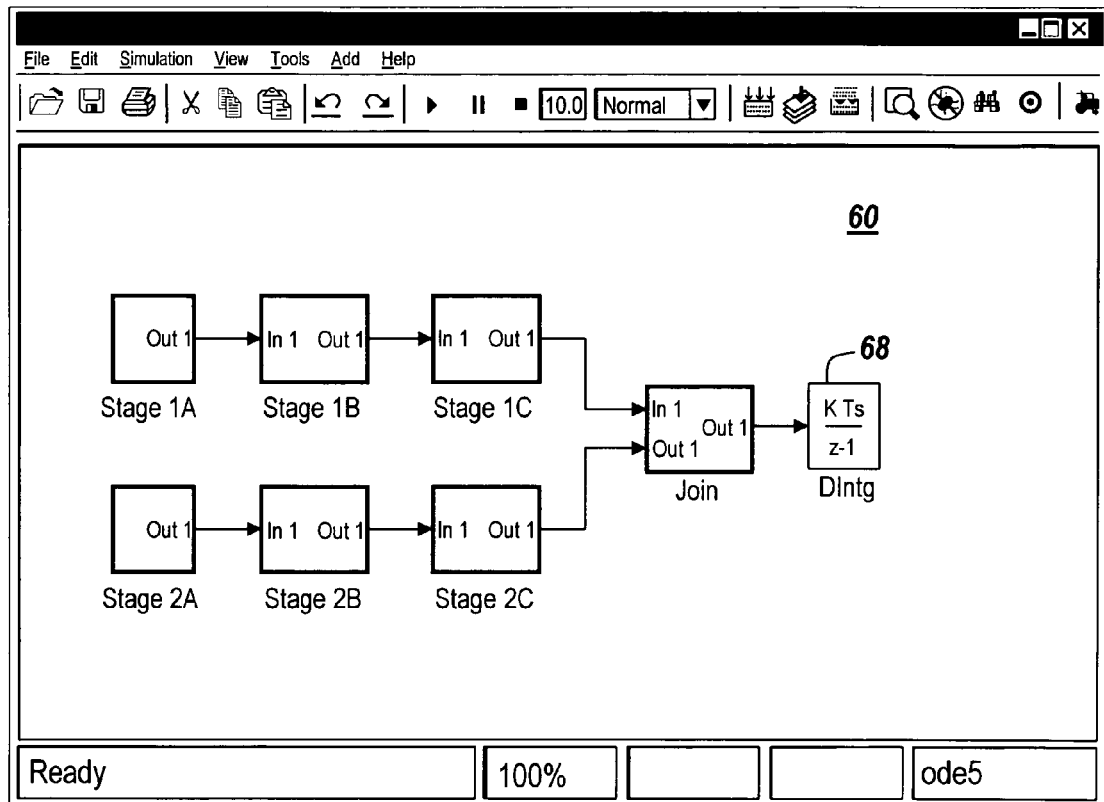
FIG. 15 depicts the construction of the block diagram model of FIG. 5 with another exemplary dialog for specifying model dependencies.
Figure 16:
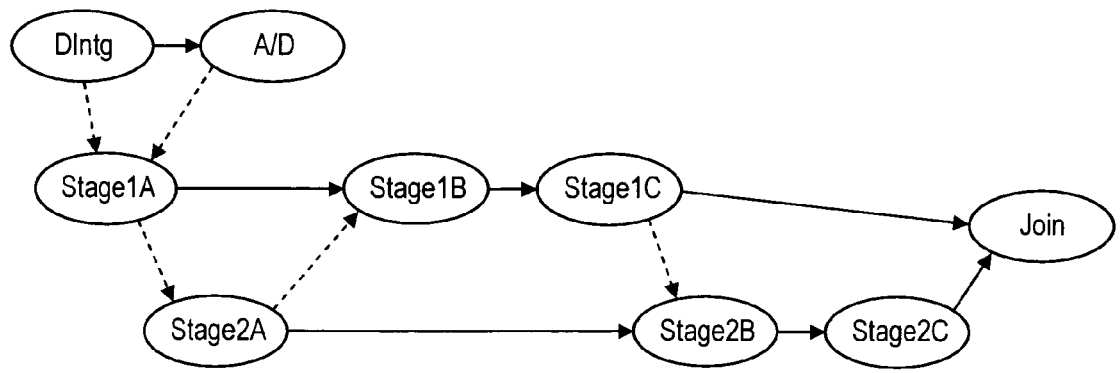
FIG. 16 depicts an exemplary internal graph representing the model dependencies.

This process may continue until the user adds the Join block 67 to the model 60, as depicted in FIG. 14. When the user adds the DIntg block 68, which is a discrete-time integrator block and doesn't have direct feedthrough, the dependency information dialog 110 is provided, as depicted in FIG. 15. The freedom to move the DIntg block 111 on the dialog 110 comes from the fact that its input does not have direct feedthrough and thus can be moved to any point in the sorted list. Assuming that the user wants it to be at the top of the sorted list, the user can continue editing the model 60 and eventually construct the model 60, as depicted in FIG. 5. The internal graph used to represent the dependency information in the model 60 is illustrated in FIG. 16.

Addition of Non-Graphical Dependency Information After Model Construction

As models scale, the user may wish to turn off edit time non-graphical dependency specification. In this case, the user may be asked to provide the dependency information after model construction, but before model execution. In a larger model, this technique may be useful to add non-graphical dependency information to the model.

Specifying the sorting information after model construction enables a user to provide explicit control of the execution of the model and/or the generated code for the mode. This explicit control can be in the form of a sorting criterion that influences which block sort is used and/or additional dependencies that influence the sort. These two forms of additional non-graphical model dependencies are two examples of how additional dependency information can be provided. These examples can be used in combination or independently. Furthermore, one skilled in the art can appreciate that there are other means by which additional non-graphical dependency information can be added after model construction. One benefit of being able to specify this additional dependency information is that the order of operations is fully specified by the user.

Specification of the additional dependency information after model construction, also enables one to explicitly alter the way the model executes. For example, in time-based block diagrams, one may wish to override direct feed through relationships, thereby implicitly inserting a delay.

It is possible to both specify additional dependency information during model construction and after model construction.

Figure 17:
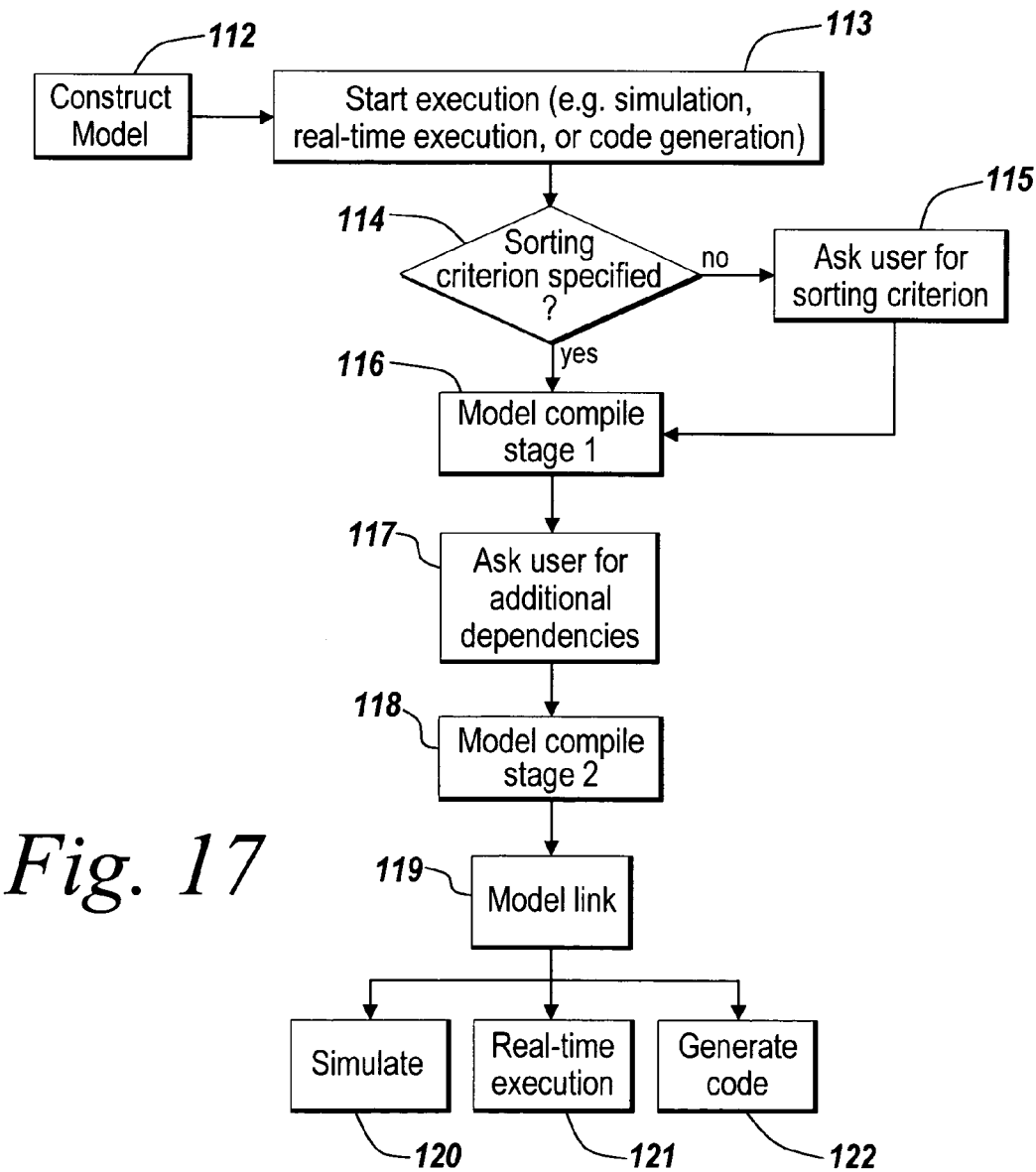
FIG. 17 depicts a flow chart showing an exemplary operation for adding dependency information after model edit or construction time.

FIG. 17 depicts a flow chart showing an exemplary operation for adding dependency information after a model is constructed. After constructing the model (step 112), the user "starts execution (step 113)." Execution is a general term that is often equated with simulation of a model (step 120). Execution may also mean real-time execution where the model is executed in real-time, i.e. synchronized with physical time (step 121), or the execution can mean the process of translating the model to generated code (e.g. C/C++/Java, assembly, HDL, etc.) (step 122).

Figures 18, 19:
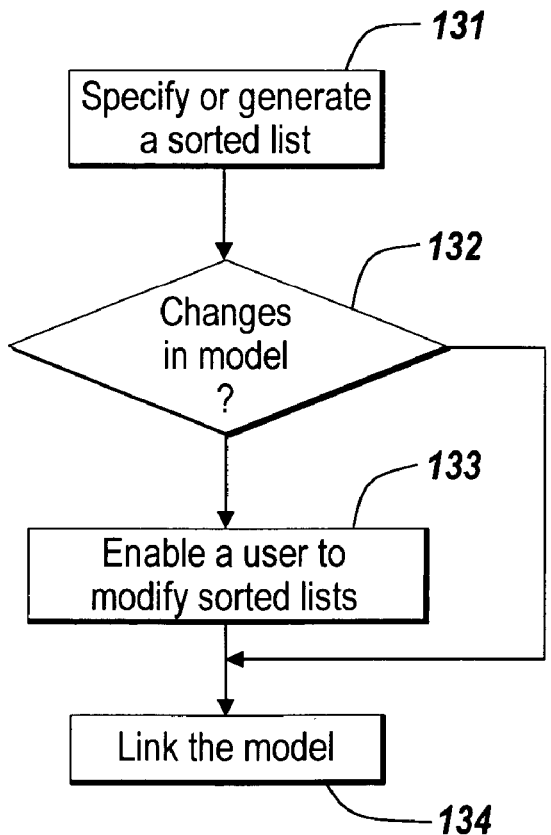
FIG. 18 depicts an exemplary dialog for specifying model dependencies.
FIG. 19 is a flow chart showing an exemplary operation for changing an existing sorted list.

After starting execution the system may prompt the user for a sorting criterion. This criterion can be changed at any time during model construction. However, if not specified (step 114), the system may choose to prompt the user for a sorting criterion (step 115). An example dialog asking the user for the sorting criterion is shown in FIG. 18. The sorting criterion greatly influences model execution.

FIG. 18 shows an exemplary dialog 125 that can be provided to the user to obtain a sorting criterion. The dialog 125 may provide various options for generating a sorted list, such as optimal code generation, natural connectivity placement, sink ASAP placement, and user defined condition, as depicted in FIG. 18. One of skill in the art will appreciate that these options are illustrative and not limiting the scope of the present invention. After the user selects one or more options provided on the dialog 125 for the dependencies of the model, the model is compiled to generate a sorted list based on the information specified by the user on the dialog 125.

The sorting criterion is dependent on the model domain. For example, in time-based block diagrams, to achieve optimal stability performance of a control system, there should be minimal delay between reading system inputs and producing outputs. This translates into placing the sink blocks which write to hardware as soon as possible in the sorted list (sink ASAP placement). An alternative sorting criterion is to group blocks together to generate optimal (more efficient) code. This criterion can conflict with the sink ASAP placement criterion. Natural connectivity placement is a means by which a strict ordering can be defined (e.g. left-to-right, top-to-bottom) thereby ensuring a unique sort for the model. Alternatively, a user defined condition can be specified whereby a user-defined comparison function is defined and sorting uses this function to choose a desired sort.

Each of the sorting criterions should adhere to dependency information shown in the diagram. It is possible to define a criterion that does not adhere to dependency information shown in the diagram. For example, a user could define a custom sorting criterion that places explicitly marked blocks in particular locations in the sort list. This may violate dependency information shown in the diagram (via the lines connecting blocks). For time-based diagrams, this violation of dependency information could be handled by inserting a "unit delay" action. Alternatively, each of the block methods may be evaluated more than once.

After the initial sort is chosen based on a desired criterion (step 116), the user then has the ability to add additional non-graphical dependency information (step 117). An updated sort is generated based on the additional non-graphical dependency information (step 118) and the updated sort is used in the subsequent steps including model link (step 119), simulation (step 120), real-time execution (step 121) or code generation (step 122). A dialog such as that of FIG. 20A enables the user to add or remove non-graphical dependency information. In this figure, there is a hierarchy of sorted lists, the top-level "Root sys" contains a set of blocks, a, b, c, and Locked sys. The locked sys is a hierarchical node that in turn contains a set of blocks d, e, and f. In the preferred embodiment, the user can drag blocks to their desired location, thereby adding non-graphical dependency information. The dragging can be constrained such that dependency information in the block diagram as defined by the lines connecting the blocks is not violated. Alternatively, the user may choose to violate the dependency information found in the graphical model. In time-based block diagrams, this violation would be treated as a unit delay operation, or may result in multiple calls to evaluate the blocks. The sorted list is annotated to indicate this behavior. In addition, the diagram may be annotated if desired to illustrate where dependency information in the graphical model was altered by the non-graphical dependency information.

Figure 20A:
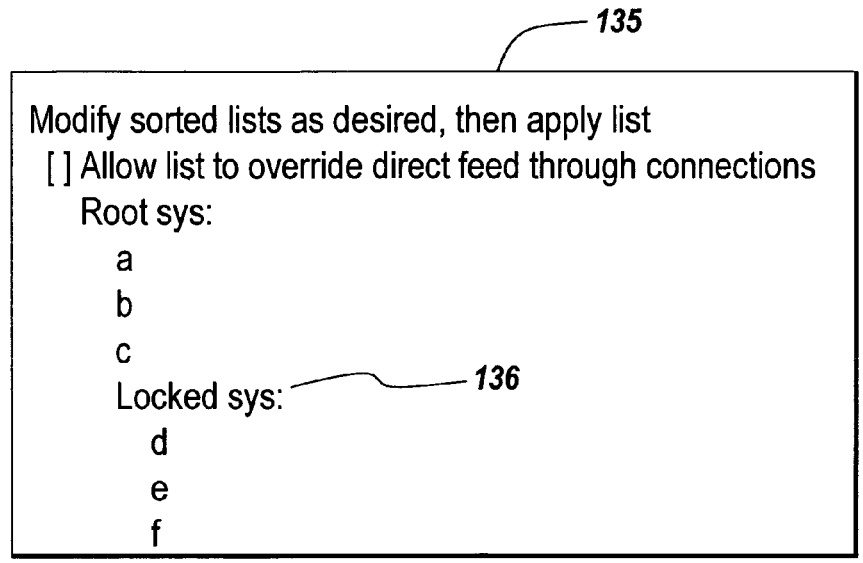
FIG. 20A depicts an exemplary dialog for changing the existing sorted list.

In addition to being able to drag the sorted lists, the dialog in FIG. 20A can be used to high-light direct feed through relationships. Selecting a block, say "b" may cause "a" to highlight indicating that "a" must come before "b" in the sorted list to ensure that the graphical dependency information is maintained.

The dialog in FIG. 20A can also be used to high-light algebraic loops (that is a set of blocks that all have direct feed-through and are connected in a cycle). Each algebraic loop appears by default as a contiguous set of blocks, thus it is desirable to move algebraic loops in the sorted list as a unit (i.e. treat the algebraic loop as a single movable unit). It is also possible to move individual blocks with in the unit and/or alter the algebraic variables of the loop. Specifying the algebraic variables is a form of non-graphical dependency information. The user need not be constrained to move algebraic loops as a unit. There may be good reason to move blocks such that the algebraic loop is eliminated (by altering the direct feed through relationships via non-graphical model dependencies).

Blocks in the sorted list can have initial output conditions. Suppose "a" is connected to "b" and "b" has direct feed-through, i.e. needs the value of "a" to compute its output in an optimal fashion. If a user moves "b" in front of "a", then "b" will read the previous value of "a" (unit delay action). Therefore, the output of "a" must have an initial output condition to execute the model. Therefore, the dialog of FIG. 20A can be setup to show in the sorted lists, blocks that have initial output and optionally allow the user to change the initial output of the blocks.

Changing of Existing Sorted List

In the illustrative embodiment, the sorted list can be specified during the construction of the model or generated at the compilation process based on the information entered by a user after the construction of the model. After the sorted list is specified or generated, blocks in the graphical model can be added or removed or connections between blocks can be changed at a later stage (model construction/edit). When changes occur in the model, the changes may affect the existing sorted list. Therefore the illustrative embodiment enables the user to see how their previous sort was affected and lets them add additional dependency information if needed to ensure the new sort meets their needs.

FIG. 19 is a flow chart showing an exemplary operation for changing a sorted list. The sorted list may be specified during the model construction time, as described above with reference to FIG. 8-16, or can be generated at the model compilation time based on the model dependency information, as described above with reference to FIGS. 17 and 18 (step 131). The model is checked to determine whether there are any changes in the model after the existing sort list specified or generated (step 132). If the changes have occurred, the user may be provided with a dialog that enables the user to change the existing sorted list (step 133). FIG. 20A shows an exemplary dialog 135 provided to the user for changing the existing sorted list. The dialog may provide the existing sorted list from which the user can make changes. The user can make changes using a drag and drop method. The changes can be saved as a property of the blocks in the model.

Some of the benefits of specifying or locking down sorted lists are that changes to the graphical model can be controlled such that they have minimal impact on the execution. When a model has an existing sorted list specification (defined via a set of non-graphical dependencies), and the model is edited (altered by inserting or deleting blocks or lines), the system may use the previous sorted list specification as a primer for the new sorted list, thereby minimizing the impact of the change on model execution or the generated code. Having minimal change in the generated code is very valuable for safety-critical applications because previous testing and code inspections are not completely invalidated.

Another benefit of specifying or locking down the sorted lists is that one can capture implicit dependencies between blocks. Consider FIG. 5, if Stage1A, 61 communicates with Stage2A, 64 through a "hidden" means such as global or shared memory, and the communication protocol dictates that Stage1A must run before Stage2A, then specifying a non-graphical dependency will ensure the communication protocol is adhered to. Using the current state of the art technology, one could use lines to signify this relationship, however there are situations where it is desirable to hide certain relationships, such as this example where the communication may only be needed for the simulation and is naturally enforced when using the generated code in a target system.

Hyper-Linking

Figure 20B:
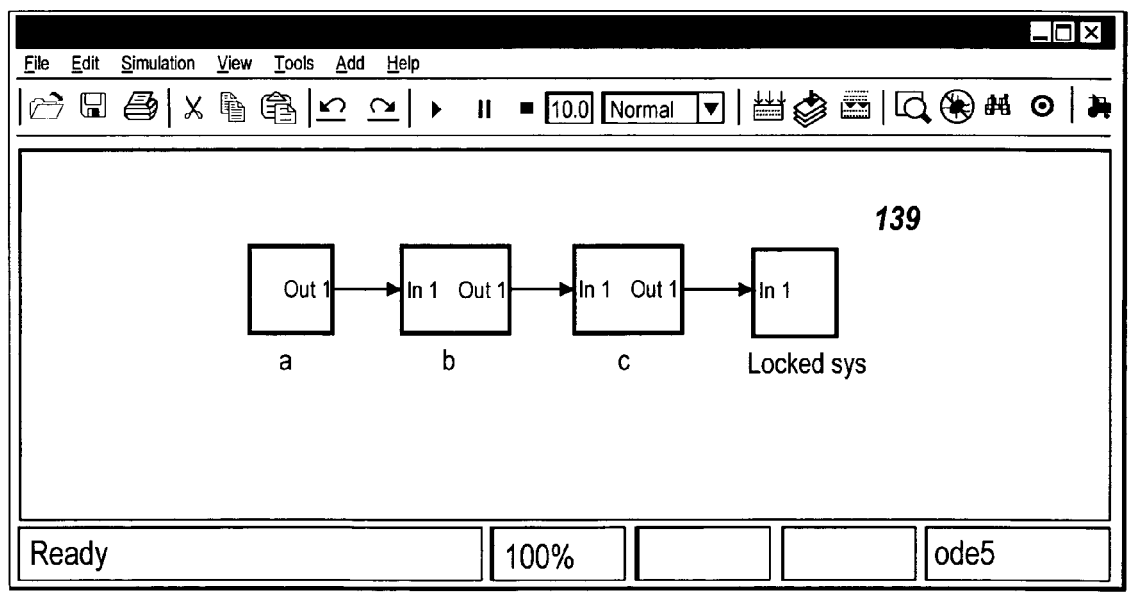
FIG. 20B depicts an exemplary model hyper-linked by the sorted list shown in FIG. 20A.

The sorted lists shown in FIG. 20A may be hyper-linked back to the block diagram, thereby enabling the user to bring into view the relevant portion of the model when looking at the sorted list. For example, the user selects the Root sys in the user interface 135, a window shown in FIG. 20B can be provided for displaying the model that corresponds to the Root sys. In the window shown in FIG. 20B, the Root sys 139 includes a block, b block, c block and Locked sys. If the user selects the Locked sys 136, the window shown in FIG. 20B may display a portion of the model that corresponds to the Locked sys 136. In the window shown in FIG. 20B, the user may navigate to the Locked sys by selecting the Locked sys block. Likewise the block diagram may be hyper-linked by to the sorted list enabling the user to navigate from the model to the sorted list quickly.

Debugging Annotation

The illustrative embodiment is described relative to the non-graphical dependencies represented by internally constructing a graph. The non-graphical dependencies are not displayed on the visual representation of a block diagram model and do not affect the readability of the diagram. As a debugging or analysis aid, however, the illustrative embodiment can be extended to display these dependencies on the diagram. The dependencies can be illustrated as dotted lines or with different color than the visual representation of the diagram model. The signals that do not influence block sorting can be removed from the visual representation of the block diagram model.

Application of the Present Invention

Hierarchical Sorted Lists

The addition of non-graphical dependency information described above in the illustrative embodiment may apply to a hierarchical model that includes different levels of modules, such as subsystems in Simulink®. The subsystems can be virtual or non-virtual. A subsystem is virtual if its constituent blocks are moved back into the main block diagram model during the model's execution. Virtual subsystems serve the purpose of providing the block diagram with a graphical hierarchy. Non-virtual subsystems behave like an elemental dynamic system with its own execution methods (Output, Update, Derivatives, etc.). The illustrative embodiment may sort the blocks in the hierarchical block diagram into a hierarchical sort list. In the hierarchical sort list, the root block diagram has a sorted-list associated with it and each non-virtual subsystem layer and some special block diagram elements also each have their own sorted-list. Referring back to FIG. 20A, for example, the dialog 135 shows a hierarchical sort list of a model including the sorted list of a, b, c and a subsystem called Locked subsystem 136. The Locked subsystem 136 has its own sorted list of d, e and f.

Implicit Dependencies

The addition of non-graphical dependency information described above in the illustrative embodiment may also apply to implicit dependencies in a block diagram model. The non-graphical dependency information can be added to the model to specify implicit dependencies. Implicit communication occurs when one block's internals access information from another block. This can occur using Simulink® Data Store blocks. For example, referring back to FIG. 5, the Stage1B block 62 may read information from the Stage2A block 64 via a Data Store Read of a Data Store Memory that was written to by a Data Store Write in the Stage2A block 64. This is an example of an implicit requirement that should be taken into account when sorting is done. Ideally, this would be done without drawing lines. Data stores are one example. Another example would be user defined custom blocks (S-functions) that perform interaction with the external environment. For example the Stage1B block 62 may read a physical (analog input from an Analog to Digital converter) and the Stage2A block 64 may be responsible for writing to the physical device signals that influence the input that the Stage1B block 62 is requesting.

Model Integration

The addition of non-graphical dependency information described above in the illustrative embodiment may be useful in integrating multiple models into a single model. The integration of multiple models into a single model is described in co-pending U.S. patent application Ser. No. 11/141,878 entitled "MODELING OF A MULTIPROCESSOR SYSTEM" and filed on May 31, 2005, which is incorporated by reference. The addition of non-graphical dependency information of the present invention ensures correct simulation and generated code behavior by specifying how the combined models execute in a single model.

Generated Code

The addition of non-graphical dependency information described above in the illustrative embodiment may be useful in ensuring that the generated code for the model appears as desired. Specifying sort list constraints means that execution of block methods is explicitly specified by the user. The translation of a block diagram to generated code (e.g. a high-level language such as C/C++/Java/Ada, assembly, or a hardware description language), follows that of normal model execution (simulation). Thus, generated code is directly influenced by the additional dependency information, thereby ensuring that desired design goals are met. The specification of additional dependency information ensures that the models do not get wrong answer. This helps unit testing and migrating to newer releases. This also helps verifying the behavior of the model. This has the advantage of traceability, both in simulation (e.g. debugging) and in the generated code (inspection or execution).

Changing Answer Without Changing Model

The specification of non-graphical dependencies in the illustrative embodiment can be used to change the answers of a model without changing the visual representation of the model. The specification of non-graphical dependencies may treat lines or signals as a data store and remove the direct feedthrough requirements in the block diagram model. Since changing dependencies can be interpreted as inserting a unit delay on the lines, the specification of non-graphical dependencies can change the answer of the model without diagram clutter.

Applying Non-Graphical Dependencies to Other Domains

The addition of non-graphical model dependency information can be implemented in other domains, such as state-based and flow diagrams, entity flow network diagrams, and data flow diagrams. In the state-based and flow diagrams, such as those found in Stateflow from The MathWorks, Inc., the present invention can apply to provide execution view of charts where dependencies are specified. In the data flow diagrams, the present invention can apply to show how parallel examples and additional orderings can be specified. Those of ordinary skill in the art will appreciate the state-based and flow diagrams, entity flow network diagrams, and data flow diagrams are illustrative and not limiting the scope of the present invention.

Figure 21:
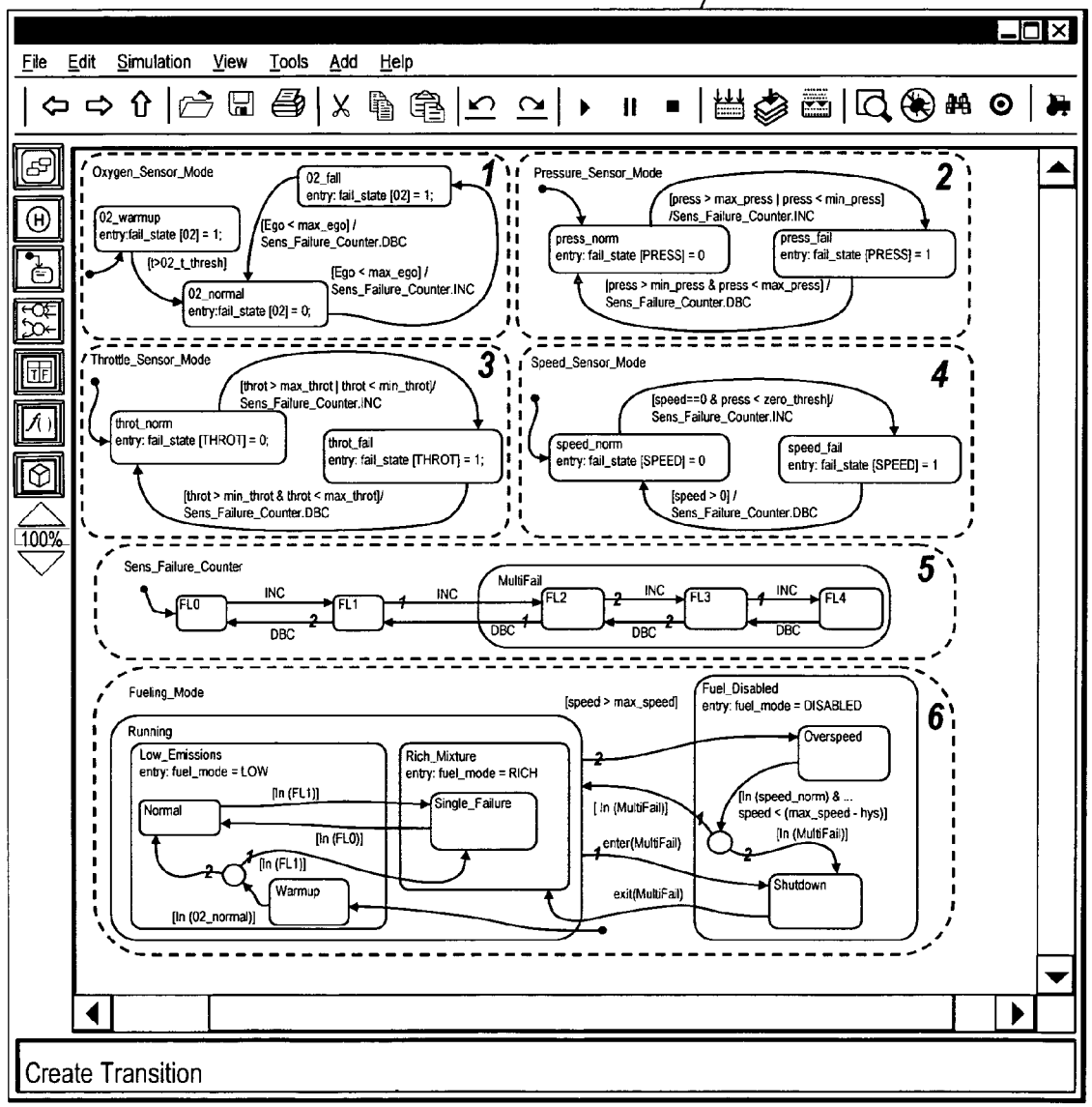
FIG. 21 is an example of a state-based and flow diagram to which the concept of the present invention applies.

FIG. 21 is a user interface 140 showing an exemplary state-based and flow diagram, such as a Stateflow chart, which contains six parallel states. In the illustrative embodiment, the ordering can be specified by the number in the upper right corner that can be controlled by a user via non-graphical dependency using a table depicted in FIG. 22. This table 150 may have properties similar to that of FIG. 20A whereby the user can drag the parallel state name to the appropriate location to define the ordering of the parallel states. For example, the user can drag the Fueling_Mode state name 154 to the location prior to the Throttle_Sensor_Mode name 152 to change the ordering of the parallel states. This aspect may be useful for large charts that cannot be seen all at once.

FIG. 23 is an exemplary data flow diagram that represents a=b+c. This data flow diagram has four operations, the read of b block 162 to produce a token 168 for the first input of the + block 166, the read of c block 164 to produce a token 168 for the second input of the + block 166, the sum operation (+ block 166), and finally sorting of the result by the 'a' block 168. It may be desirable to ensure that the read of b block 162 comes before the read of c block 164, which can be done using non-graphical dependency information using an editor 170 such as that of FIG. 24. The non-graphical dependency information shown in this example has been reducing to only show the degrees of freedom that don't violate the dependency information shown in the model. Alternatively, one could let any operation be order, in which case dependencies in the data flow diagram that are broken may be annotated with a "memory store" annotation indicating a read before write is occurring.

Since certain changes may be made without departing from the scope of the present invention, it is intended that all matter contained in the above description or shown in the accompanying drawings be interpreted as illustrative and not in a literal sense. For example, the illustrative embodiment of the present invention may be practiced in any graphical modeling environments. Practitioners of the art will realize that the sequence of steps and architectures depicted in the figures may be altered without departing from the scope of the present invention and that the illustrations contained herein are singular examples of a multitude of possible depictions of the present invention.

What is claimed is:

1. In a computational device, a method for providing non-graphical dependency information in a graphical modeling environment, the method comprising:
   providing a graphical model in a graphical modeling environment, the model comprising one or more evaluatable components;
   adding non-graphical model dependency information to the graphical model, the non-graphical model dependency information specifying an order in which at least some of the components are evaluated, wherein the components can be evaluated in more than one order during an evaluation of the graphical model, the model including a visual representation, the visual representation remaining unchanged when the non-graphical model dependency information is added;
   requesting additional non-graphical model dependency information when the components can be evaluated in more than one order, where the additional non-graphical model dependency information ensures one unique order; and
   storing the graphical model with the non-graphical model dependency information in a storage.

2. The method of claim 1, where the storing further comprises:
   storing the non-graphical model dependency information as a property of blocks in the graphical model.

3. The method of claim 1, further comprising:
   representing the non-graphical model dependency information in an internal graph of the graphical model.

4. The method of claim 1, wherein the non-graphical model dependency information influences model execution.

5. The method of claim 1, wherein the non-graphical model dependency information influences code generation.

6. The method of claim 1, wherein the non-graphical dependency information is added based on design considerations.

7. The method of claim 6, wherein the design considerations comprise at least one of optimal memory usage or optimal execution efficiency.

8. The method of claim 1, wherein the information is added at a model edit or construction time.

9. The method of claim 1, wherein the information is added after model construction and before model execution.

10. The method of claim 1, wherein the information is added by specification of a sorting criterion.

11. The method of claim 1, wherein the information is changed after model construction before model execution.

12. The method of claim 1, further comprising:
    displaying the non-graphical model dependency information with the visual representation of the graphical model; and
    analyzing the graphical model using the non-graphical model dependency information or the visual representation of the graphical model.

13. The method of claim 1, further comprising:
    programmatically accessing the non-graphical dependency information; and
    manipulating the accessed non-graphical dependency information.

14. In a computational device, a method for providing a sorted-list display in a graphical modeling environment, the method comprising:
    providing a graphical model in a graphical modeling environment, the graphical model comprising a plurality of executable components;
    adding non-graphical model dependency information to the graphical model, the non-graphical model dependency information specifying an order in which at least some of the components are evaluated, wherein the components can be evaluated in more than one order during an evaluation of the graphical model, the model including a visual representation, the visual representation remaining unchanged when the non-graphical model dependency information is added; and
    requesting additional non-graphical model dependency information when the components can be evaluated in more than one order, where the additional non-graphical model dependency information ensures one unique order; and
    storing the graphical model with the non-graphical model dependency information in a storage.

15. The method of claim 14, further comprising:
    generating a hyper-link from the graphical model to the sorted-list.

16. The method of claim 14, wherein dependencies are displayed in an explicit graphical form.

17. The method of claim 16, wherein the graphical form comprises a hierarchical list or a hierarchical graph.

18. The method of claim 14, further comprising:
    generating a hyper-link from the sorted-list to the graphical model.

19. A computer system for adding non-graphical dependency information to a graphical model comprising one or more components and having a visual representation, the computer system comprising:
    a processor for:
        presenting an interface for adding non-graphical model dependency information to the graphical model, at least one of the components of the graphical model being associated with a method that is executed in more than one order during an evaluation of the graphical model and the non-graphical model dependency information defining an order the method is evaluated during the evaluation of the graphical model, the visual representation of the graphical model remaining unchanged when the non-graphical model dependency information is added,
        requesting additional non-graphical model dependency information when the method can be evaluated in more than one order, where the additional non-graphical model dependency information ensures one unique order, and executing a graphical modeling environment to provide the graphical model; and a storage for:
   storing the graphical model with the non-graphical model dependency information.

20. The computer system of claim 19, wherein the storing further comprises:
storing the non-graphical model dependency information as a property of blocks in the graphical model.

21. The computer system of claim 19, further comprising:
an internal graph of the graphical model for representing the non-graphical model dependency information in the graphical modeling environment.

22. The computer system of claim 19, wherein the non-graphical model dependency information influences model execution.

23. The computer system of claim 19, wherein the non-graphical model dependency information influences code generation.

24. The computer system of claim 19, wherein the user interface provides design considerations for adding the non-graphical dependency information to the model.

25. The computer system of claim 24, wherein the design considerations comprise at least one of optimal memory usage or optimal execution efficiency.

26. The computer system of claim 19, wherein the information is added at a model edit or construction time.

27. The computer system of claim 19, wherein the information is added after model construction and before model execution.

28. The computer system of claim 19, wherein the information is added by specification of a sorting criterion.

29. The computer system of claim 19, wherein the information is changed after model construction before model execution.

30. The computer system of claim 19, further comprising:
a display device for displaying the non-graphical model dependency information on the visual representation of the graphical model for an analysis of the graphical model.

31. The computer system of claim 19, wherein the non-graphical dependency information is programmatically accessed and manipulated.

32. A non-transitory computer-readable medium for holding computer executable instructions that when executed in a computer, provide non-graphical model dependency information in a graphical modeling environment, the medium holding:
   instructions for providing a graphical model in a graphical modeling environment, the graphical model comprising a plurality of components that can be evaluated in two or more orders during an evaluation of the graphical model;
   instructions for receiving one or more criteria specifying an execution goal, the instructions including adding non-graphical model dependency information to the graphical model, the non-graphical model dependency information specifying an order in which at least some of the components are evaluated, the model including a visual representation, the visual representation remaining unchanged when the non-graphical model dependency information is added;
   instructions for requesting additional non-graphical model dependency information when more than one execution order is possible, where the additional non-graphical model dependency information ensures one unique order;
   sorting the components of the model to comply with the execution goal; and
   instructions for storing the graphical model with the non-graphical model dependency information in a storage.

33. The medium of claim 32, where the instructions for storing further holding:
instructions for storing criteria as a property of blocks in the graphical model.

34. The medium of claim 32, further holding:
instructions for representing the criteria in an internal graph of the graphical model.

35. The medium of claim 32, wherein criteria influences model execution.

36. The medium of claim 32, wherein the criteria influences code generation.

37. The medium of claim 32, wherein the criteria is added based on design considerations.

38. The medium of claim 37, wherein the design considerations comprise at least one of optimal memory usage or optimal execution efficiency.

39. The medium of claim 32, wherein the criteria is added at a model edit or construction time.

40. The medium of claim 32, wherein the criteria is added after model construction and before model execution.

41. The medium of claim 32, wherein the criteria is added by specification of a sorting criterion.

42. The medium of claim 32, wherein the criteria is changed after model construction before model execution.

43. The medium of claim 32, further holding:
   instructions for displaying the criteria with the visual representation of the graphical model; and
   instructions for analyzing the graphical model using the criteria.

44. The medium of claim 32, further holding:
   instructions for programmatically accessing the criteria; and
   instructions for manipulating the accessed criteria.

45. In a computational device, a method for providing non-graphical dependency information in a graphical modeling environment, the method comprising:
   providing a graphical model that includes model information in a graphical modeling environment, the model comprising one or more evaluatable components;
   identifying information that is separate from the model information, the information influencing execution of the graphical model;
   adding non-graphical model dependency information to the graphical model, the non-graphical model dependency information specifying an order in which at least some of the components are evaluated, wherein the components can be evaluated in more than one order during an evaluation of the graphical model, the model including a visual representation, the visual representation remaining unchanged when the non-graphical model dependency information is added;
   requesting additional non-graphical model dependency information when it is determined that more than one evaluation order is possible, where the additional non-graphical model dependency information ensures one unique order;
   sorting the components of the graphical model into a sorted list; and
   storing the graphical model with the non-graphical model dependency information in a storage.

46. The method of claim 45, wherein the information defines model dependency information.

47. The method of claim 46, wherein the model dependency information is defined by optimal code generation or system stability.

48. The method of claim 45, wherein the information is defined after model construction and before model execution.

49. The method of claim 45, wherein the graphical modeling environment comprises a state-based and flow diagram environment.

50. A non-transitory computer-readable medium holding computer executable instructions that when executed on a computer provide non-graphical dependency information in a graphical modeling environment, the medium holding:
   instructions for providing a graphical model that includes model information in a graphical modeling environment, the model comprising one or more evaluatable components;
   instructions for identifying information that is separate from the model information, the information influencing execution of the graphical model;
   instructions for adding non-graphical model dependency information to the graphical model, the non-graphical model dependency information specifying an order in which at least some of the components are evaluated, wherein the components can be evaluated in more than one order during an evaluation of the graphical model, the model including a visual representation, the visual representation remaining unchanged when the non-graphical model dependency information is added;
   instructions for requesting additional non-graphical model dependency information when it is determined that more than one evaluation order is possible, where the additional non-graphical model dependency information ensures one unique order;
   instructions for sorting the components of the graphical model into a sorted list; and
   instructions for storing the graphical model with the non-graphical model dependency information in a storage.

51. The medium of claim 50, wherein the information defines model dependency information.

52. The medium of claim 51, wherein the model dependency is defined by optimal code generation or system stability.

53. The medium of claim 50, wherein the information is defined after model construction and before model execution.

54. The medium of claim 50, wherein the graphical modeling environment comprises a state-based and flow diagram environments.

55. In a computational device, a method for providing non-graphical dependency information in a graphical modeling environment, the method comprising:
   providing a graphical model comprising a plurality of blocks in a graphical modeling environment;
   adding non-graphical model dependency information to the graphical model, the non-graphical model dependency information describing a dependency between two or more of the blocks, wherein the dependency specifies an order in which at least some of the blocks are evaluated, wherein the blocks can be evaluated in more than one order during an evaluation of the graphical model, the model including a visual representation, the visual representation remaining unchanged when the non-graphical model dependency information is added;
   requesting additional non-graphical model dependency information when it is determined that more than one evaluation order is possible, where the additional non-graphical model dependency information ensures one unique order;
   transforming the graphical model into a directed graph comprising one or more arcs and one or more vertices, the arcs representing data dependencies between the vertices;
   using the directed graph to sort the blocks into a sorted list that takes into consideration dependencies between the blocks, the blocks being sorted at least in part based on the non-graphical model dependency information; and
   storing the graphical model with the non graphical model dependency information in a storage.

56. In a computational device, a method for providing non-graphical dependency information in a graphical modeling environment, the method comprising:
   providing a graphical model in a graphical modeling environment, the model comprising one or more evaluatable components;
   adding non-graphical model dependency information to the graphical model, the non-graphical model dependency information specifying an order in which at least some of the components are evaluated, wherein the components can be evaluated in more than one order during an evaluation of the graphical model, the model including a visual representation, the visual representation remaining unchanged when the non-graphical model dependency information is added;
   requesting additional non-graphical model dependency information when it is determined that more than one evaluation order is possible, where the additional non-graphical model dependency information ensures one unique order;
   providing multiple sorted-lists for the graphical model, the sorted-lists defining an execution order in the graphical model;
   selecting one sorted-list from the multiple sorted-lists; and
   storing the selection in a storage.

57. The method of claim 56, further comprising:
   dynamically selecting one sorted-list among the multiple sorted-lists using a user interface.

58. The method of claim 57, wherein one sorted-list is selected the graphical model is executing.

* * * * *

UNITED STATES PATENT AND TRADEMARK OFFICE
CERTIFICATE OF CORRECTION

| | | |
|---|---|---|
| PATENT NO. | : 7,861,217 B2 | Page 1 of 1 |
| APPLICATION NO. | : 11/323533 | |
| DATED | : December 28, 2010 | |
| INVENTOR(S) | : John Edward Ciolfi | |

It is certified that error appears in the above-identified patent and that said Letters Patent is hereby corrected as shown below:

At column 5, line 34 of the printed patent, please change "simplorerfrom" to
--Simplorer from--.

Signed and Sealed this
Twenty-fourth Day of May, 2011

David J. Kappos
*Director of the United States Patent and Trademark Office*